(12) United States Patent
Wang et al.

(10) Patent No.: US 12,176,882 B2
(45) Date of Patent: Dec. 24, 2024

(54) MULTIPLEXER WITH FILTER INCLUDING DIFFERENT TYPES OF ACOUSTIC WAVE RESONATORS

(71) Applicant: Skyworks Solutions, Inc., Irvine, CA (US)

(72) Inventors: Yiliu Wang, Irvine, CA (US); Nan Wu, Irvine, CA (US); Tomoya Komatsu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 283 days.

(21) Appl. No.: 17/653,834

(22) Filed: Mar. 7, 2022

(65) Prior Publication Data

US 2022/0294421 A1  Sep. 15, 2022

Related U.S. Application Data

(60) Provisional application No. 63/160,509, filed on Mar. 12, 2021, provisional application No. 63/160,316, filed on Mar. 12, 2021, provisional application No. 63/160,525, filed on Mar. 12, 2021.

(51) Int. Cl.
*H03H 9/25*  (2006.01)
*H03F 3/19*  (2006.01)
*H03H 9/02*  (2006.01)
*H03H 9/64*  (2006.01)
*H03H 9/72*  (2006.01)
(Continued)

(52) U.S. Cl.
CPC ............... *H03H 9/25* (2013.01); *H03F 3/19* (2013.01); *H03H 9/02834* (2013.01); *H03H 9/6483* (2013.01); *H03H 9/725* (2013.01); *H04B 1/0057* (2013.01); *H04B 1/40* (2013.01); *H03F 2200/451* (2013.01)

(58) Field of Classification Search
CPC .... H03H 9/25; H03H 9/02834; H03H 9/6483; H03H 9/725; H03H 9/706; H03F 3/19; H03F 2200/451; H04B 1/0057; H04B 1/40

See application file for complete search history.

(56) References Cited

U.S. PATENT DOCUMENTS

| | | |
|---|---|---|
| 6,424,238 B1 | 7/2002 | Penunuri |
| 9,077,311 B2 | 7/2015 | Yan et al. |
| 9,231,557 B2 | 1/2016 | Umeda et al. |

(Continued)

OTHER PUBLICATIONS

U.S. Appl. No. 17/653,847, filed Mar. 7, 2022, Multiplexer With Acoustic Wave Filter Including Different Types Of Resonators.

(Continued)

*Primary Examiner* — Andrea Lindgren Baltzell
*Assistant Examiner* — Kimberly E Glenn
(74) *Attorney, Agent, or Firm* — Knobbe, Martens, Olson & Bear, LLP

(57) ABSTRACT

Aspects of this disclosure relate to multiplexers with acoustic wave resonators. The multiplexer includes a first filter and a second filter. The first filter includes a plurality of bulk acoustic wave resonators and a shunt surface acoustic wave resonator. The shunt acoustic wave resonator can have a resonant frequency in a passband of the second filter. The passband of the second filter is below a passband of the first filter. In certain applications, the first filter is a receive filter and the second filter is a transmit filter.

20 Claims, 21 Drawing Sheets

(51) Int. Cl.
   *H04B 1/00*      (2006.01)
   *H04B 1/40*      (2015.01)

(56)           References Cited

U.S. PATENT DOCUMENTS

| | | | |
|---|---|---|---|
| 10,367,475 | B2 | 7/2019 | Caron |
| 10,541,673 | B2 | 1/2020 | Caron |
| 11,012,054 | B2 | 5/2021 | Caron |
| 11,101,787 | B2 | 8/2021 | Ando et al. |
| 2009/0315640 | A1* | 12/2009 | Umeda .......... H03H 9/725 333/133 |
| 2016/0294423 | A1* | 10/2016 | Yatsenko .......... H04B 1/1036 |
| 2019/0319605 | A1 | 10/2019 | Ando et al. |
| 2019/0319606 | A1 | 10/2019 | Ando et al. |
| 2019/0319772 | A1 | 10/2019 | Ando et al. |
| 2020/0228100 | A1 | 7/2020 | Caron |
| 2020/0358424 | A1 | 11/2020 | Kaneda et al. |
| 2020/0403601 | A1 | 12/2020 | Komatsu et al. |
| 2021/0058069 | A1 | 2/2021 | Komatsu |
| 2021/0099152 | A1 | 4/2021 | Goto et al. |
| 2021/0111694 | A1 | 4/2021 | Goto et al. |
| 2021/0111705 | A1 | 4/2021 | Komatsu |
| 2021/0126619 | A1 | 4/2021 | Wang et al. |
| 2021/0126625 | A1 | 4/2021 | Wang et al. |
| 2021/0313965 | A1 | 10/2021 | Caron |
| 2022/0294422 | A1 | 9/2022 | Wang et al. |
| 2022/0294423 | A1 | 9/2022 | Wang et al. |

OTHER PUBLICATIONS

U.S. Appl. No. 17/653,850, filed Mar. 7, 2022, Acoustic Wave Filter Including Different Types Of Resonators.

U.S. Appl. No. 17/653,850, Published As 2022/0294423 A1, filed Mar. 7, 2022, Acoustic Wave Filter Including Different Types Of Resonators.

U.S. Appl. No. 17/653,847, Published As 2022/0294422 A1, filed Mar. 7, 2022, Multiplexer With Acoustic Wave Filter Including Different Types Of Resonators.

* cited by examiner

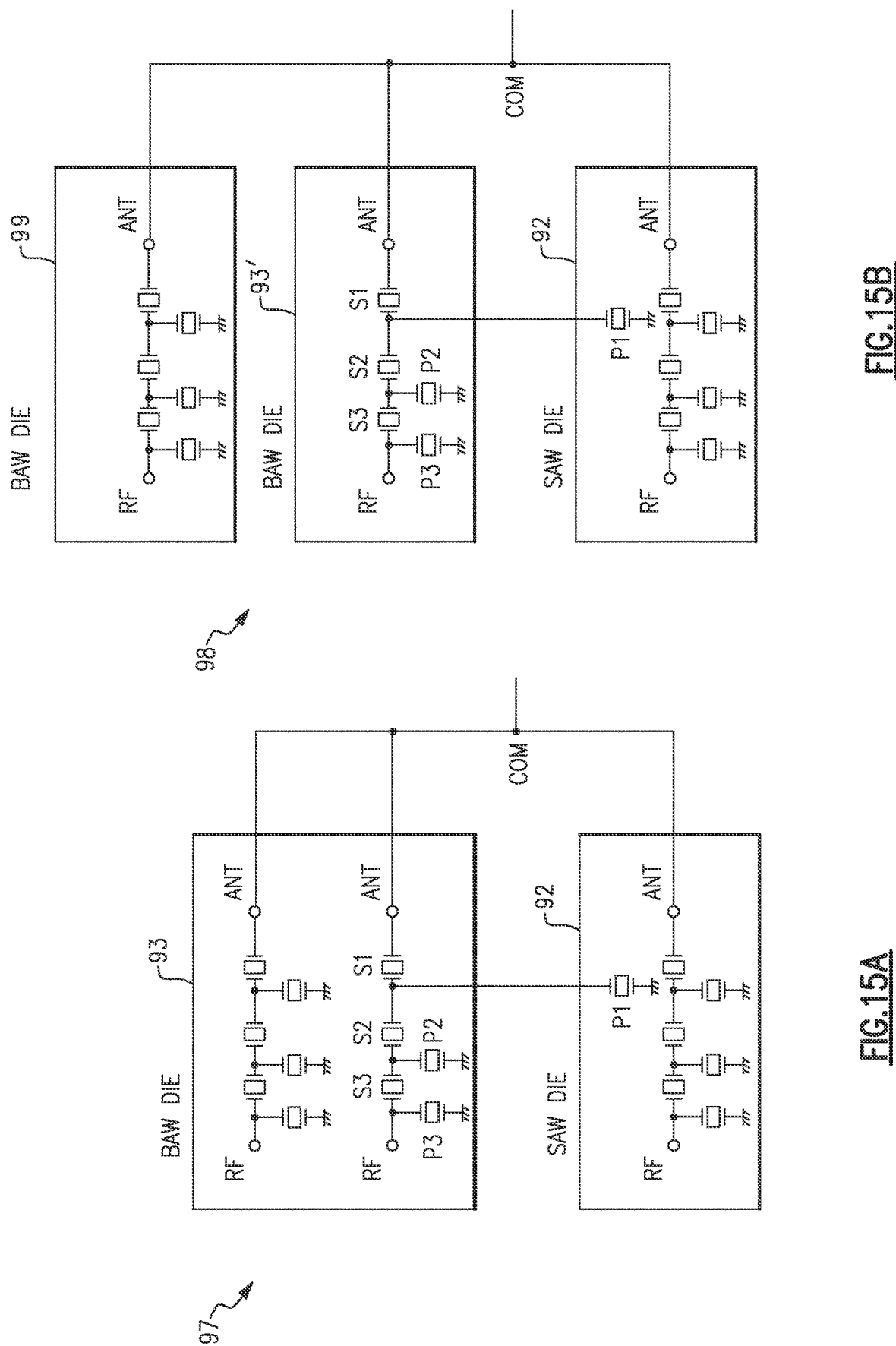

MULTIPLEXER WITH FILTER INCLUDING DIFFERENT TYPES OF ACOUSTIC WAVE RESONATORS

CROSS REFERENCE TO PRIORITY APPLICATIONS

This application claims the benefit of priority of U.S. Provisional Patent Application No. 63/160,316, filed Mar. 12, 2021 and titled "MULTIPLEXER WITH FILTER INCLUDING DIFFERENT TYPES OF ACOUSTIC WAVE RESONATORS," also claims the benefit of priority of U.S. Provisional Patent Application No. 63/160,509, filed Mar. 12, 2021 and titled "ACOUSTIC WAVE FILTER INCLUDING DIFFERENT TYPES OF RESONATORS," and also claims the benefit of priority of U.S. Provisional Patent Application No. 63/160,525, filed Mar. 12, 2021 and titled "MULTIPLEXER WITH ACOUSTIC WAVE FILTER INCLUDING DIFFERENT TYPES OF RESONATORS," the disclosures of each which are hereby incorporated by reference in their entireties herein.

BACKGROUND

Technical Field

Embodiments of this disclosure relate to acoustic wave filters.

Description of Related Technology

An acoustic wave filter can include a plurality of resonators arranged to filter a radio frequency signal. Example acoustic wave resonators include surface acoustic wave (SAW) resonators and bulk acoustic wave (BAW) resonators. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. In BAW resonators, acoustic waves propagate in a bulk of a piezoelectric layer. Example BAW resonators include film bulk acoustic wave resonators (FBARs) and BAW solidly mounted resonators (SMRs).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

Acoustic wave filters with relatively low second harmonic distortion are generally desirable. Second harmonic distortion specifications are becoming more demanding in certain applications. Meeting such second harmonic distortion specifications can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a multiplexer with acoustic wave resonators. The multiplexer includes a first filter configured to filter a radio frequency signal and a second filter coupled to the first filter at a common node. The first filter has a first passband. The first filter includes a plurality of bulk acoustic wave resonators and a shunt surface acoustic wave resonator. The second filter has a second passband that is below the first passband. The shunt surface acoustic wave resonator has a resonant frequency that is in the second passband.

The first filter can be a receive filter. The second filter can be a transmit filter.

The shunt surface acoustic wave resonator can cause second harmonic distortion at the common node to be reduced. The shunt surface acoustic wave resonator can be an only surface acoustic wave resonator of the first filter. The shunt surface acoustic wave resonator can be a first shunt acoustic wave resonator of the first filter from the common node. The shunt surface acoustic wave resonator and the plurality of bulk acoustic wave resonators can be all acoustic wave resonators of the first filter.

The shunt surface acoustic wave resonator can be a temperature compensated surface acoustic wave resonator. The shunt surface acoustic wave resonator can be a multilayer piezoelectric substrate surface acoustic wave resonator.

The second filter can include a second plurality of acoustic wave resonators. The second plurality of acoustic wave resonators can include bulk acoustic wave resonators.

The first filter can include a series surface acoustic wave resonator and all of the plurality of bulk acoustic wave resonators can be coupled to the common node by way of the series surface acoustic wave resonator. The shunt series surface acoustic wave resonator can be coupled to the common node by way of the series surface acoustic wave resonator. The second filter can include a second plurality of bulk acoustic wave resonators. The second plurality of bulk acoustic wave resonators can include shunt bulk acoustic wave resonators and series bulk acoustic wave resonators. The second plurality of bulk acoustic wave resonators can be all acoustic resonators of the second filter. The second filter can be a transmit filter.

The multiplexer can be a duplexer. The multiplexer can further include a third filter coupled to the common node.

The second passband can be associated with a fifth generation New Radio band.

Another aspect of this disclosure is a multiplexer including acoustic wave filters. The multiplexer includes a transmit filter and a receive filter coupled to the transmit filter at a common node. The transmit filter includes a plurality of acoustic wave resonators. The transmit filter is configured to filter a radio frequency signal. The transmit filter has a transmit passband. The receive filter includes a plurality of bulk acoustic wave resonators and a shunt surface acoustic wave resonator. The shunt surface acoustic wave resonator has a resonant frequency in the transmit passband.

The plurality of acoustic wave resonators can include bulk acoustic wave resonators. The shunt surface acoustic wave resonator can be a first shunt acoustic wave resonator of the receive filter from the common node.

Another aspect of this disclosure is a multiplexer including acoustic wave filters. The multiplexer includes a first acoustic wave filter coupled to a common node, a second acoustic wave filter coupled to the common node, and a third acoustic wave filter coupled to the common node. The first acoustic wave filter is configured to filter a radio frequency signal. The first acoustic wave filter has a passband. The third acoustic wave filter includes a plurality of bulk acoustic wave resonators and a shunt surface acoustic wave resonator. The shunt surface acoustic wave resonator has a resonant frequency in the passband.

The third acoustic wave filter can be a receive filter, and the first acoustic wave filter can be a transmit filter. The shunt surface acoustic wave resonator can be an only surface acoustic wave resonator of the third acoustic wave filter.

The shunt surface acoustic wave resonator can be a first shunt acoustic wave resonator of the third acoustic wave filter from the common node. The shunt surface acoustic wave resonator and the plurality of bulk acoustic wave resonators can be all acoustic wave resonators of the third acoustic wave filter.

Another aspect of this disclosure is an acoustic wave filter that includes an antenna port, a shunt surface acoustic wave resonator, and a plurality of bulk acoustic wave resonators including a plurality of series bulk acoustic wave resonators and a plurality of shunt bulk acoustic wave resonators. A single one of the plurality of series bulk acoustic wave resonators is coupled between the shunt surface acoustic wave resonator and the antenna port. The acoustic wave filter is configured to filter a radio frequency signal.

The shunt surface acoustic wave resonator can be configured to cause second harmonic distortion at the antenna port to be reduced. The shunt surface acoustic wave resonator can be a temperature compensated surface acoustic wave resonator. The shunt surface acoustic wave resonator can be a multilayer piezoelectric substrate surface acoustic wave resonator.

The plurality of series bulk acoustic wave resonators can be all series acoustic wave resonators of the acoustic wave filter. The shunt surface acoustic wave resonator can be an only surface acoustic wave resonator of the acoustic wave filter.

The acoustic wave filter can be configured as a receive filter. The acoustic wave filter can be a band pass filter with a passband associated with a fifth generation New Radio band. The acoustic wave filter can be a band pass filter with a passband associated with a fifth generation New Radio receive band.

Another aspect of this disclosure is an acoustic wave filter that includes an antenna port, a plurality of acoustic wave resonators of a first type including a plurality of series acoustic wave resonators of the first type and a plurality of shunt acoustic wave resonators of the first type, and a shunt acoustic wave resonator of a second type. The shunt acoustic wave resonator of the second type has lower second harmonic distortion than the acoustic wave resonators of the first type. A single one of the plurality of series acoustic wave resonators of the second type are coupled between the shunt acoustic wave resonator of the first type and the antenna port. The acoustic wave filter configured to filter a radio frequency signal.

The plurality of series acoustic wave resonators of the first type can be all series acoustic wave resonators of the acoustic wave filter. The shunt acoustic wave resonator of the second type can be an only acoustic wave resonator of the second type of the acoustic wave filter.

The acoustic wave filter can be a receive filter. The acoustic wave filter can be a band pass filter with a passband associated with a fifth generation New Radio band.

Another aspect of this disclosure is a multiplexer including acoustic wave filters. The multiplexer includes a transmit filter configured to filter a radio frequency signal and a receive filter coupled to the transmit filter at a common node. The transmit filter includes acoustic wave resonators. The receive filter includes a shunt surface acoustic wave resonator, a plurality of series bulk acoustic wave resonators, and a plurality of shunt bulk acoustic wave resonators. A single one of the plurality of series bulk acoustic wave resonators is coupled between the shunt surface acoustic wave resonator and the common node.

The shunt surface acoustic wave resonator can be configured to cause second harmonic distortion at the common node to be reduced. The shunt surface acoustic wave resonator can be a multilayer piezoelectric substrate surface acoustic wave resonator. The shunt surface acoustic wave resonator can be an only surface acoustic wave resonator of the receive filter. The receive filter can be a band pass filter with a passband associated with a fifth generation New Radio band. The transmit filter can include a second plurality of series bulk acoustic wave resonators and a second plurality of shunt bulk acoustic wave resonators.

Another aspect of this disclosure is a multiplexer including one or more acoustic wave filters. The multiplexer includes a first filter configured to filter a radio frequency signal and a second filter coupled to the first filter at a common node. The first filter includes a plurality of acoustic wave resonators of a first type and a shunt acoustic wave resonator of a second type. The shunt acoustic wave resonator of the second type has lower second harmonic distortion than the acoustic wave resonators of the first type. The second filter has a passband. The shunt acoustic wave resonator of the second type has a resonant frequency in the passband.

The acoustic wave resonators of the first type can each have a higher quality factor than the shunt acoustic wave resonator of the second type.

The first filter can be a receive filter. The second filter can be a transmit filter. The second filter can include a plurality of acoustic wave resonators.

The shunt acoustic wave resonator of the second type can be an only acoustic wave resonator of the second type of the first filter. The shunt acoustic wave resonator of the second type can be a first shunt acoustic wave resonator of the first filter from the common node.

The shunt acoustic wave resonator of the second type and the plurality of acoustic wave resonators of the first type can be all acoustic wave resonators of the first filter.

The first filter can include a series acoustic wave resonator of the second type and all other acoustic wave resonators of the first filter can be coupled to the common node by way of the series acoustic wave resonator of the second type. The second filter can include a second plurality of acoustic wave resonators of the first type. The second plurality of acoustic wave resonators of the first type can be all acoustic resonators of the second filter. The second filter can be a transmit filter.

The multiplexer can be a duplexer. The multiplexer can include a third filter coupled to the common node.

The passband can be associated with a fifth generation New Radio band.

Another aspect of this disclosure is a radio frequency module that includes a multiplexer in accordance with any suitable principles and advantages disclosed herein and a radio frequency circuit element coupled to the multiplexer. The multiplexer and the radio frequency circuit element are enclosed within a common package.

The radio frequency circuit element can be a radio frequency amplifier arranged to amplify a radio frequency signal. The radio frequency amplifier can be a low noise amplifier. The radio frequency amplifier can be a power amplifier. The radio frequency module can further include a switch configured to selectively couple a terminal of an acoustic wave filter of the multiplexer to an antenna port of the radio frequency module. The radio frequency circuit element can be a switch configured to selectively couple an acoustic wave filter of the multiplexer to an antenna port of the radio frequency module.

Another aspect of this disclosure is a wireless communication device that includes a multiplexer in accordance with any suitable principles and advantages disclosed herein, an antenna operatively coupled to the multiplexer, a radio frequency amplifier operatively coupled to the multiplexer and configured to amplify a radio frequency signal, and a transceiver in communication with the radio frequency amplifier.

Another aspect of this disclosure is a method of filtering a radio frequency signal that includes: receiving a radio frequency signal at a port of a multiplexer in accordance with any suitable principles and advantages disclosed herein; and filtering the radio frequency signal with the multiplexer.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/653,850, titled "ACOUSTIC WAVE FILTER INCLUDING DIFFERENT TYPES OF RESONATORS," filed on even date herewith, the entire disclosure of which is hereby incorporated by reference herein. The present disclosure relates to U.S. patent application Ser. No. 17/653,847, titled "MULTIPLEXER WITH ACOUSTIC WAVE FILTER INCLUDING DIFFERENT TYPES OF RESONATORS," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIGS. 15A and 15B are a schematic block diagrams of acoustic wave resonators of multiplexers on a plurality of dies according to embodiments.

DETAILED DESCRIPTION OF CERTAIN EMBODIMENTS

Figure 1:
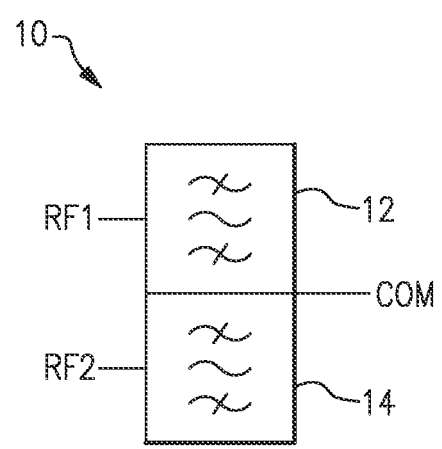
FIG. 1 is a schematic block diagram of a duplexer.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Any suitable principles and advantages of the embodiments disclosed herein can be implemented together with each other.

Acoustic wave filters can implement band pass filters. For example, bulk acoustic wave (BAW) resonators, such as film bulk acoustic wave resonators (FBARs), can be arranged to create a band pass filter. As another example, temperature compensated surface acoustic wave (TCSAW) resonators can be arranged as a band pass filter.

In acoustic band pass filter applications, low insertion loss and low second harmonic distortion is typically desired. Achieving desirable filter performance with relatively low insertion loss and relatively low second harmonic distortion can be challenging. Acoustic wave ladder filters have included BAW resonators to achieve certain filter performance specifications, such as low insertion loss. Suppressing second harmonic distortion for BAW resonators can be challenging. In fifth generation (5G) New Radio (NR) applications, suppressing one or more non-linearities can be significant at the system level. This can be due to, for example, higher peak-to-average power ratios in 5G NR applications relative to previous standards. Suppressing second harmonic distortion for BAW resonators can be significant to meeting 5G NR specifications related to linearity and/or non-linearity.

Filters with BAW resonators can achieve desirable insertion loss performance, such as desirable small signal insertion loss. However, second harmonic performance for BAW resonators can be degraded due to spikes in a frequency response from a lateral mode and/or a recessed frame mode of one or more BAW resonators. On the other hand, TCSAW resonators can achieve desirable second harmonic performance. However, TCSAW resonators can have higher insertion loss than BAW resonators. The higher insertion loss for TCSAW resonators can be due to degraded quality factor (Q) performance relative to BAW resonators.

Certain approaches to suppress second harmonic distortion for BAW resonators have focused on transmit filters. However, in multiplexers, a receive filter can create second harmonic distortion for a transmit filter. Embodiments disclosed herein relate to receive filter designs that can reduce harmonic distortion for one or more transmit filters in a multiplexer.

Aspects of this disclosure relate to acoustic wave filters that include different types of resonators to achieve low insertion loss and desirable second harmonic performance. A multiplexer can include a transmit filter and a receive filter. The transmit filter can include acoustic wave resonators arranged to filter a radio frequency signal. The transmit filter can and have a transmit passband. The receive filter can include BAW resonators and a shunt SAW resonator. The shunt SAW resonator can have a resonant frequency in the transmit passband. The shunt SAW resonator can be the first shunt resonator of the receive filter from a common node of the multiplexer. The shunt SAW resonator can be the only SAW resonator of the receive filter in certain applications. The shunt SAW resonator can be a TCSAW resonator, a non-temperature compensated SAW resonator, or a multi-layer piezoelectric substrate (MPS) SAW resonator. With the shunt SAW resonator, the transmit filter can have better second harmonic performance than if that shunt SAW resonator were a shunt BAW resonator. The receive filter can achieve desirable insertion loss with the BAW resonators and also achieve desirable second harmonic performance with a relatively small impact on the passband of the transmit filter with the shunt SAW resonator. Accordingly, the receive filter can achieve desirable performance from features of BAW resonators and the shunt SAW resonator. Such desirable performance can also contribute to desirable second harmonic performance of the transmit filter.

FIG. 1 is a schematic block diagram of a duplexer 10. The duplexer 10 includes a first filter 12 and a second filter 14 coupled to together at a common node COM. One of the filters of the duplexer 10 can be a transmit filter and the other of the filters of the duplexer 10 can be a receive filter. In some other instances, such as in a diversity receive application, the duplexer 10 can include two receive filters. Alternatively, the duplexer 10 can include two transmit filters. The common node COM can be an antenna node.

The first filter 12 is an acoustic wave filter arranged to filter a radio frequency signal. The first filter 12 includes acoustic wave resonators coupled between a first radio frequency node RF1 and the common node COM. The first radio frequency node RF1 can be a transmit node or a receive node. The second filter 14 can be any suitable filter arranged to filter a second radio frequency signal. The second filter 14 can be, for example, an acoustic wave filter, an LC filter, a hybrid acoustic wave LC filter, or the like. The second filter 14 is coupled between a second radio frequency node RF2 and the common node COM. The second radio frequency node RF2 can be a transmit node or a receive node.

Figure 2:
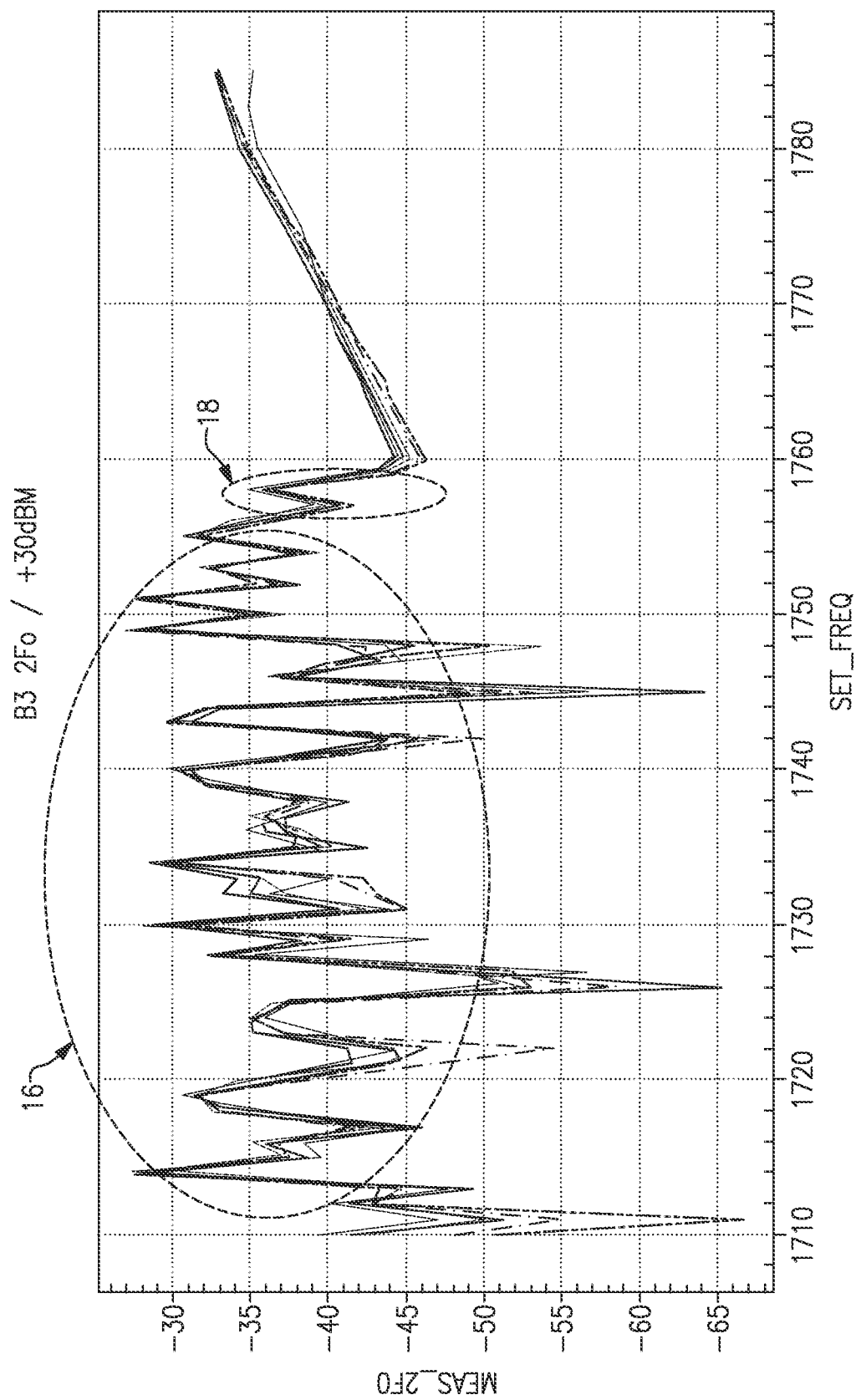
FIG. 2 is a graph illustrating second harmonic distortion for a bulk acoustic wave (BAW) filter.

In some applications, the first filter 12 can be a BAW filter where all acoustic wave resonators are BAW resonators. FIG. 2 is a graph illustrating second harmonic distortion for a bulk acoustic wave (BAW) filter. By using BAW technology, there can be lateral mode spikes 16 present in a frequency response of the BAW filter for the second harmonic. There can also be a recessed frame mode spike 18 in the frequency response. Suppressing the lateral mode spikes and recessed frame mode spike can be challenging. For 5G NR bands, non-linearity can be a significant specification at the system level. The spikes in the frequency response shown in FIG. 2 can undesirably increase non-linearity.

Figure 3:
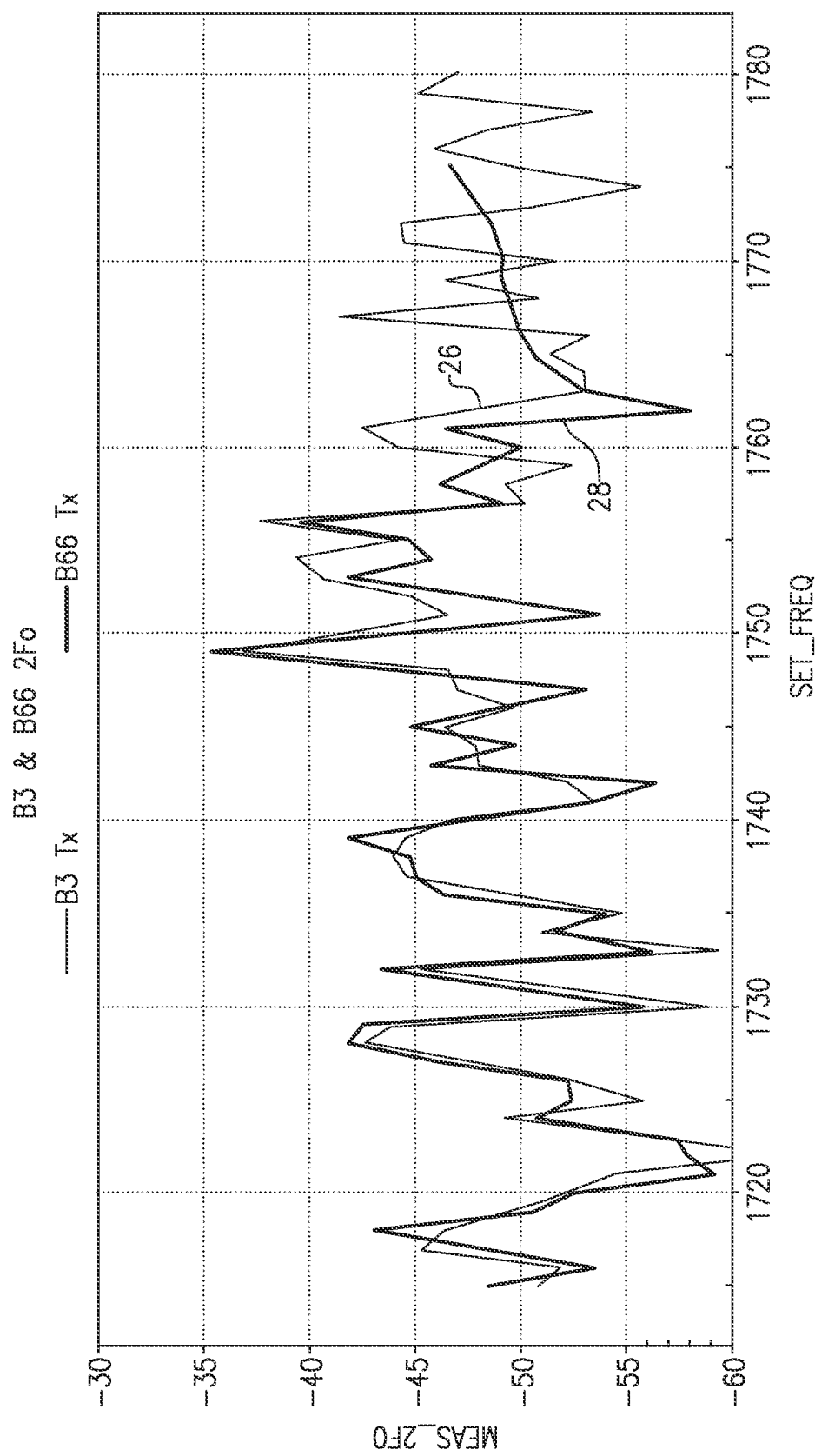
FIG. 3 is a graph illustrating that a receive filter of a duplexer can impact second harmonic performance of a transmit filter of the duplexer.

FIG. 3 is a graph illustrating that a receive filter of a duplexer can impact second harmonic performance of a transmit filter of the duplexer. FIG. 3 corresponds to frequency responses of filters of (1) a duplexer 10 with Band 3 transmit and receive filters that are each formed of BAW resonators and (2) a duplexer 10 with Band 66 transmit and receive filters that are each formed of BAW resonators. Band 3 and Band 66 have similar transmit bands (1710 megahertz (MHz) to 1785 MHz for Band 3 and 1710 MHz to 1780 MHz for Band 66). The same BAW filter was used for the Band 3 transmit filter and the Band 66 transmit filter. Band 66 has a receive band that is significantly higher than the Band 3 receive band (2110 MHz to 2200 MHz for Band 66 compared to 1805 MHz to 1880 MHz for Band 3). Accordingly, the transmit and receive bands are closer in the Band 3 duplexer than the transmit and receive bands in the Band 66 duplexer.

FIG. 3 includes two curves: a Band 3 transmit curve 26 and a Band 66 transmit curve 28. The curves 26 and 28 indicate that second harmonic performance for the Band 3 transmit band is degraded compared to the Band 66 transmit band. The Band 3 transmit curve 26 has more spikes above about 1760 MHz compared to the Band 66 transmit curve 28. This can be due to the Band 3 receive filter adding second harmonic distortion to the transmit band frequency response. The simulated Band 3 receive filter did not apply a recessed frame for shunt BAW resonators and lateral mode for such a Band 3 receive filter can be relatively strong. This can deteriorate the Band 3 transmit band second harmonic performance, particularly at a frequency range from about 1765 MHz to 1785 MHz in FIG. 3. On the other hand, the Band 66 receive filter does not have a similar impact on the Band 66 transmit filter. This can be due to the larger spacing in the frequency domain between passbands of the Band 66 transmit and receive filters.

Figure 4:
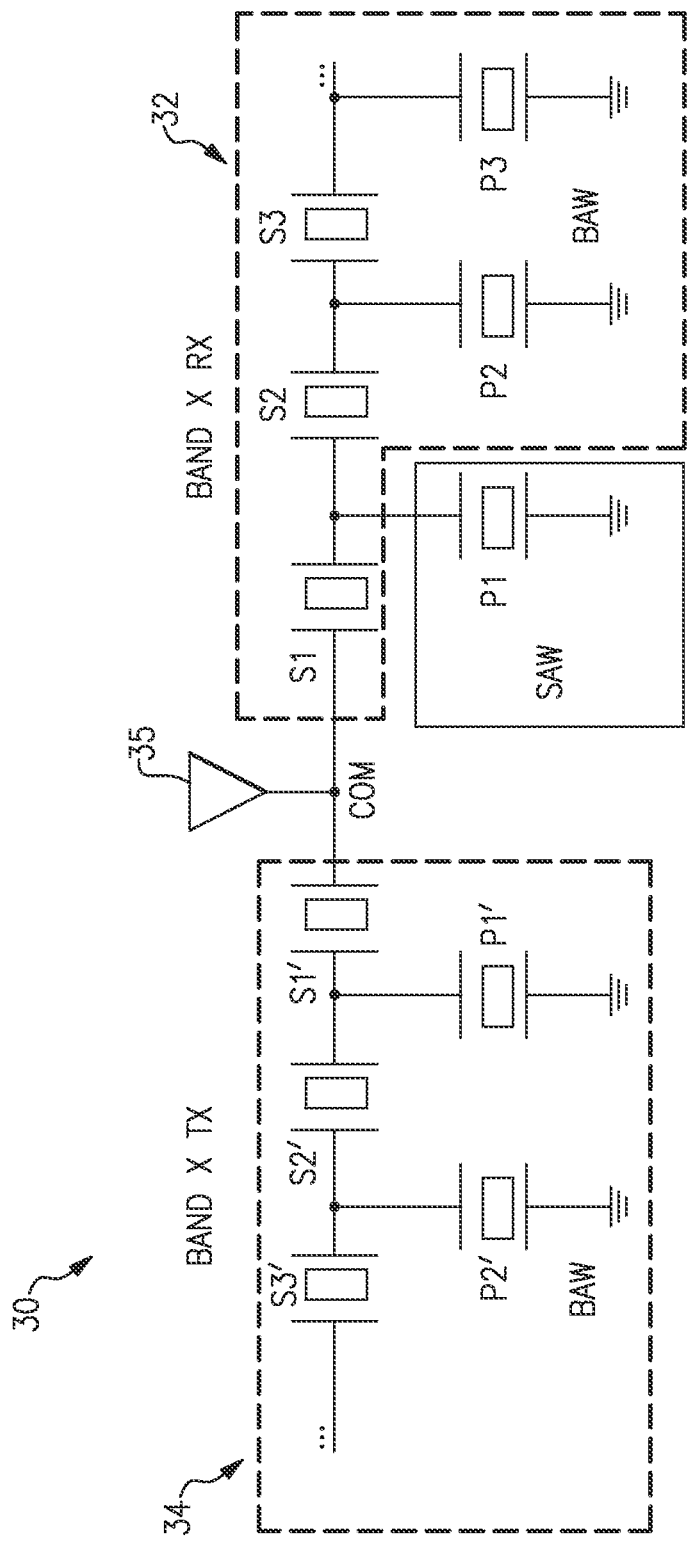
FIG. 4 is a schematic diagram of a multiplexer with a receive filter that includes a plurality of BAW resonators and a shunt surface acoustic wave (SAW) resonator according to an embodiment.

FIG. 4 is a schematic diagram of a duplexer 30 with a receive filter 32 that includes a plurality of BAW resonators S1, S2, S3, P2, and P3 and a shunt SAW resonator P1 according to an embodiment. The shunt SAW resonator P1 can be TCSAW resonator, a non-temperature compensated SAW resonator, or a MPS SAW resonator. For example, in certain applications, the shunt SAW resonator P1 is a TCSAW resonator. As another example, in some applications, the shunt SAW resonator P1 is an MPS SAW resonator. In the receive filter 32, the shunt SAW resonator P1 is the only SAW resonator. The shunt SAW resonator P1 is the first shunt resonator from the common node COM in the receive filter 32. As illustrated, the shunt SAW resonator P1 is coupled to the common node COM by way of a single series BAW resonator S1 in the receive filter 32. The duplexer 30 also includes a transmit filter 34 with a second plurality of BAW resonators S1', S2', S3', P1', P2', and P3'. The BAW resonators of the duplexer 30 can achieve relatively low insertion loss in the passbands of the receive filter 32 and the transmit filter 34. The common node COM of the duplexer 30 is coupled to an antenna 35. There can be one or more intervening circuit elements (not illustrated) in an antenna path between the common node COM of the duplexer 30 and the antenna 35.

In the duplexer 30, the receive filter 32 and the transmit filter 34 can be associated with the same frequency band. For duplexer bands where a transmit and receive band gap is relatively small (e.g., Band 3 or Band 25), the second harmonic performance of the first shunt resonator of the receive filter from the common node can impact the second harmonic performance of the transmit filter. The impact of the first shunt resonator from the common node can have the largest contribution to the second harmonic performance of the transmit filter of all shunt resonators of the receive filter.

Any suitable principles and advantages disclosed herein can be applied to a multiplexer where there is a relatively small band gap between passbands of two filters of the multiplexer. The relatively small band gap can be in a range from 10 MHz to 30 MHz in certain applications. In some such applications, the relatively small band gap can be in a range from 10 MHz to 20 MHz. As some examples, the relatively small band gap can be 15 MHz or 20 MHz. The relatively small band gap can be in a range from 10% to 40% of a passband of a filter of the multiplexer in certain applications. In some such applications, the relatively small band gap can be in a range from 20% to 30% of a passband of a filter of the multiplexer. As an example, the relatively small band gap can be 15 MHz and the passband of the filter can be 65 MHz. As another example, the relatively small band gap can be 20 MHz and the passband of the filter can be 75 MHz. The relatively small band gap can be, for example, in a range from 0.5% to 2% of a center frequency of a passband of a filter of the multiplexer, for example. In some such instances, the relatively small band gap can be in a range from 0.5% to 1% of a passband of a filter of the multiplexer. As an example, the relatively small band gap can be 15 MHz and the center frequency of the passband of the filter can be 1962.5 MHz. As another example, the relatively small band gap can be 20 MHz and the center frequency of passband of the filter can be 1842.5 MHz.

As shown in FIG. 4, the first shunt resonator of the receive filter 32 from the common node COM is a shunt surface acoustic wave resonator P1 and the other resonators of the receive filter 32 are BAW resonators S1, S2, S3, P2, and P3. A first filter stage of the receive filter 32 from the common node COM includes a shunt SAW resonator P1 and a series BAW resonator S1. As illustrated, the shunt SAW resonator P1 is coupled to the common node COM by way of the series BAW resonator S1. Alternatively, a first filter stage from a common node can include a first shunt SAW resonator and a series BAW resonator where the series BAW resonator is coupled between the shunt SAW resonator and a receive port of a receive filter. SAW resonators can generally have better second harmonic performance than BAW resonators. Accordingly, the shunt SAW resonator P1 of the receive filter 32 can result in better second harmonic performance for the transmit filter 34 relative to if a BAW resonator were used for the first shunt resonator from the common node COM in the receive filter 32. At the same time, the receive filter 32 can achieve relatively low insertion loss in the receive passband with the BAW resonators S1, S2, S3, P2, and P3. The better linearity of the transmit filter 34 due to the shunt SAW resonator P1 can be particularly advantageous in improving system level linearity in 5G NR applications. Moreover, the receive filter 32 can be implemented for 5G NR bands with relatively wide receive bandwidth to achieve low insertion loss in the receive passband.

Figure 5:
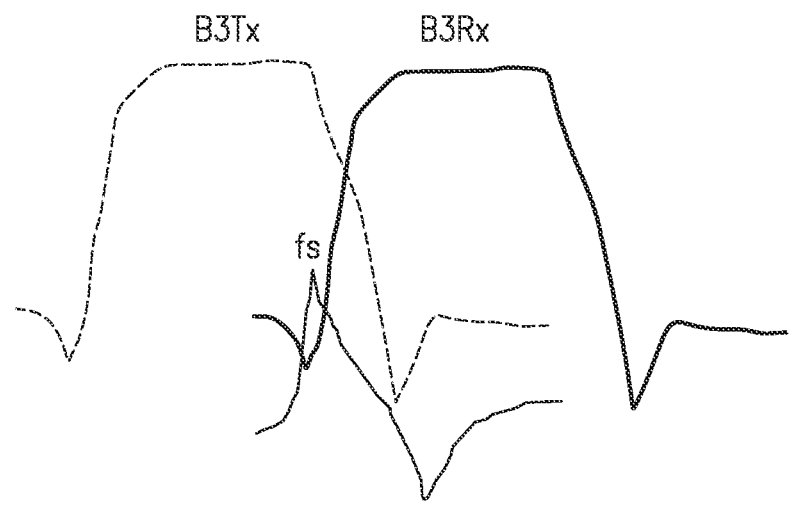
FIG. 5 is a graph that illustrates passbands of the filters of the multiplexer of FIG. 4 and a frequency response of the shunt SAW resonator of the receive filter.

FIG. 5 is a graph that illustrates passbands of example filters of the duplexer 30 of FIG. 4 and a frequency response of the shunt SAW resonator P1 of the receive filter 32. The graph of FIG. 5 corresponds to an application where the duplexer 30 is a Band 3 duplexer. This duplexer has a transmit passband B3Tx and a receive passband B3Rx. The anti-resonant frequency of the shunt SAW resonator P1 contributes to the lower band edge of the receive passband B3Rx. However, in certain applications where the transmit passband B3Tx and the receive passband B3Rx are relatively close in the frequency domain, the resonant frequency of the shunt SAW resonator P1 can impact the transmit passband B3Tx. As shown in FIG. 5, a resonant frequency fs of the shunt SAW resonator P1 is in the transmit passband B3Tx. More specifically, the illustrated resonant frequency fs of the shunt SAW resonator P1 is in an upper half of the transmit passband B3Tx. Accordingly, the second harmonic performance of the shunt SAW resonator P1 can impact second harmonic performance of the transmit passband B3Tx in the duplexer 30. This can reduce second harmonic distortion in the transmit passband B3Tx for the transmit filter 34 in the duplexer 30.

Figure 6:
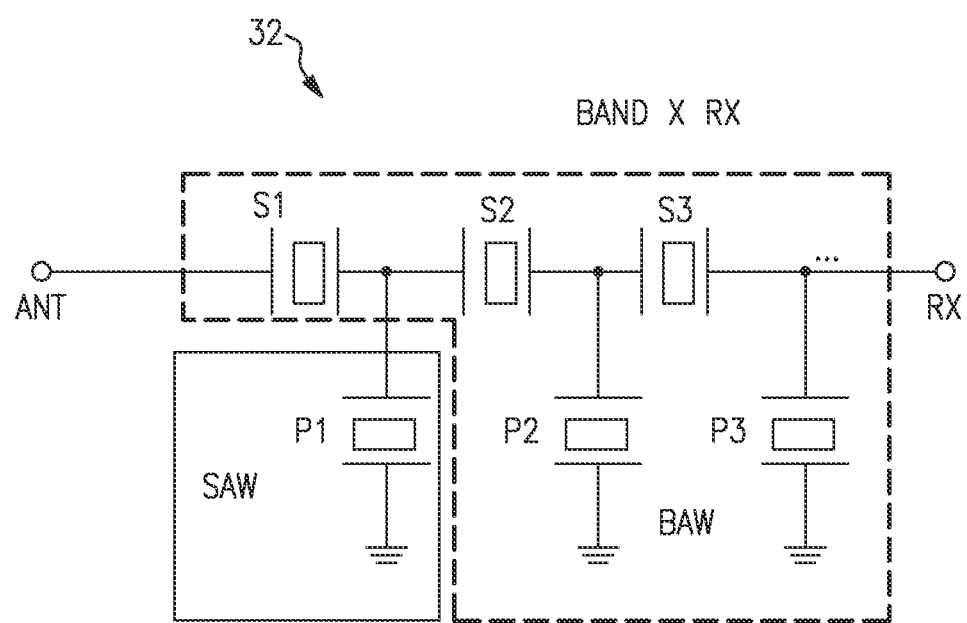
FIG. 6 is a schematic diagram of a receive filter that includes a plurality of BAW resonators and a shunt SAW resonator according to an embodiment.

FIG. 6 is a schematic diagram of the receive filter 32 that includes a plurality of BAW resonators S1, S2, S3, P2, and P3 and a shunt SAW P1 resonator according to an embodiment. The receive filter 32 can filter a radio frequency signal propagating from an antenna port ANT to a receive port RX. The first shunt acoustic resonator from the antenna port is the shunt SAW resonator P1. The first stage of the receiver filter 32 from the antenna node ANT includes a shunt SAW resonator and a series BAW resonator. FIG. 6 illustrates that the receive filter 32 can be implemented as a standalone filter. Any of the filters disclosed herein can be implemented as a standalone filter in certain applications as suitable.

Additional embodiments of multiplexers will now be discussed. Any suitable combination of features of the multiplexers disclosed herein can be implemented together with each other.

Figure 7:
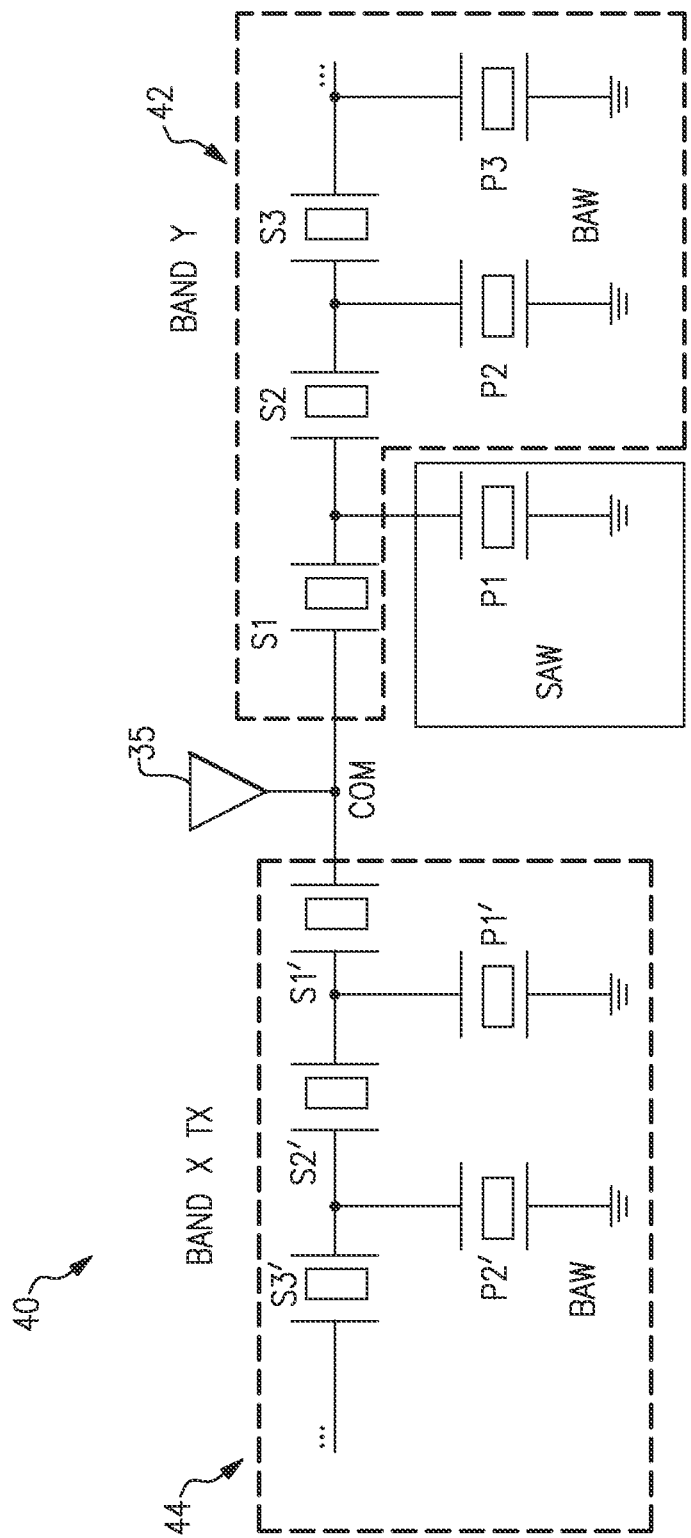
FIG. 7 is a schematic diagram of a multiplexer with a first filter associated with a first band and a second filter associated with a second band according to an embodiment.

FIG. 7 is a schematic diagram of a duplexer 40 with a first filter 42 associated with a first band and a second filter 44 associated with a second band according to an embodiment. The first filter 42 includes a plurality of BAW resonators S1, S2, S3, P2, and P3 and a shunt SAW resonator P1. The second filter 44 includes a second plurality of BAW resonators S1', S2', S3', P1', P2', and P3'. The second filter 44 can be a transmit filter. The first filter 42 can be a receive filter in certain applications. The first filter 42 can be a transmit filter in some other applications. The band gap between respective passbands of the first filter 42 and the second filter 44 can be relatively small. Examples of such a relatively small band gap are provided herein.

The shunt SAW resonator P1 of the first filter 42 can have a resonant frequency in a passband of the second filter 44. By the shunt SAW resonator P1 being a SAW resonator instead of a BAW resonator, the shunt SAW resonator P1 can contribute to the second filter 44 achieving better second harmonic performance.

Figure 8:
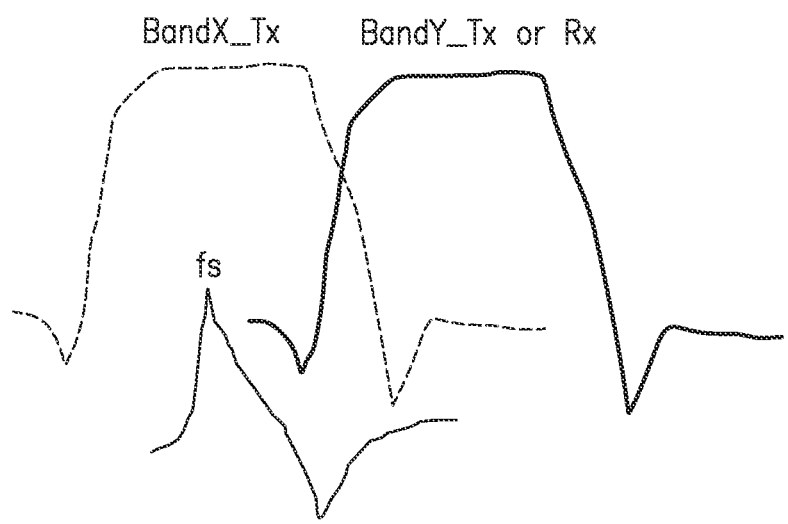
FIG. 8 is a graph that illustrates passbands of the filters of the multiplexer of FIG. 7 and a frequency response of the shunt SAW resonator of the first filter.

FIG. 8 is a graph that illustrates passbands of the filters 42 and 44 of the duplexer 40 of FIG. 7 and a frequency response of the shunt SAW resonator P1 of the first filter 42. The graph of FIG. 8 corresponds to an application where the second filter 44 is a Band X transmit filter and the first filter 42 is a Band Y filter. The first filter 42 can be either a Band Y transmit filter or a Band Y receive filter. As shown in FIG. 8, a resonant frequency fs of the shunt SAW resonator P1 of the first filter 42 is in the passband of the Band X transmit passband. Since the resonant frequency fs is within the Band X transmit passband, using a shunt SAW resonator P1 instead of a BAW resonator can increase second harmonic performance for the second filter 44. In the application corresponding to FIG. 8, the resonant frequency fs of the shunt SAW resonator P1 can be significantly lower than the lower frequency side skirt of the passband of the Band Y filter.

Figure 9:
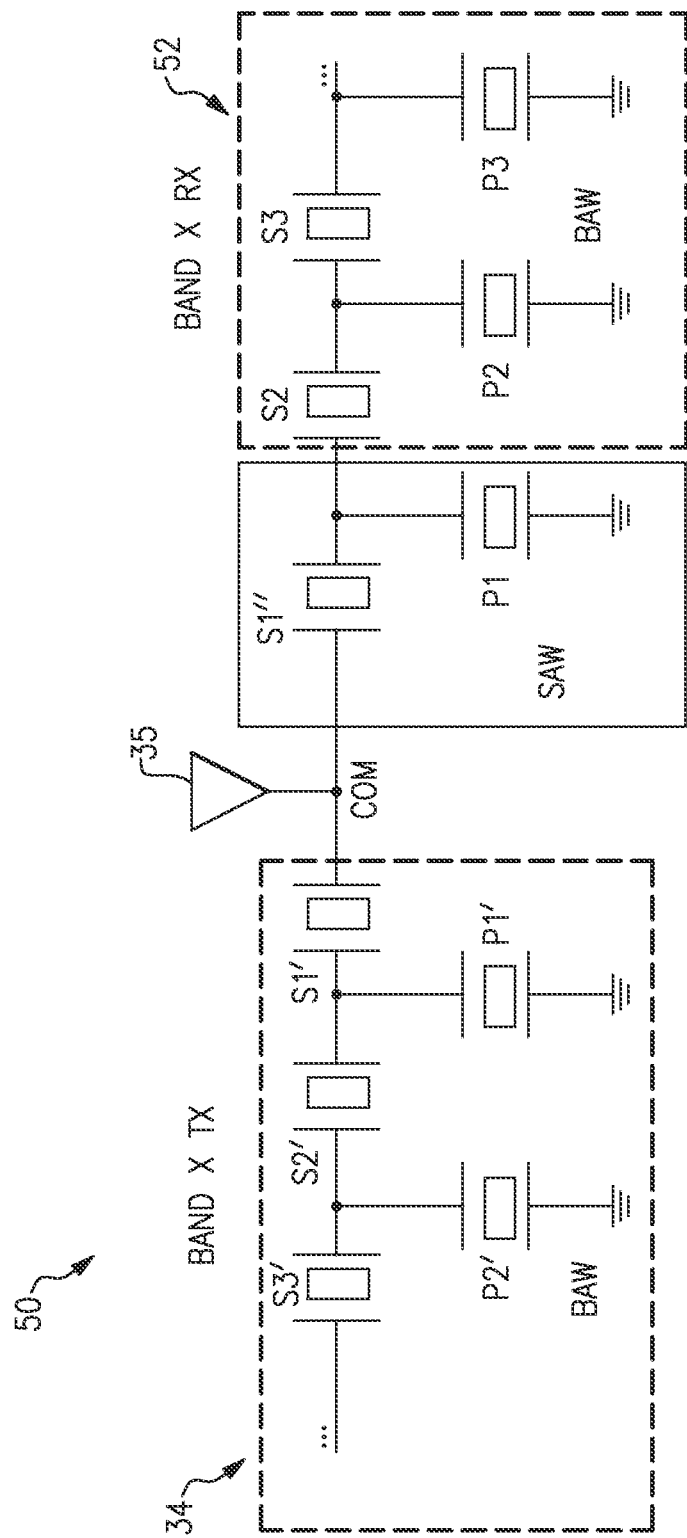
FIG. 9 is a schematic diagram of a multiplexer with a receive filter that includes a plurality of BAW resonators, a shunt SAW resonator, and a series SAW resonator according to an embodiment.

FIG. 9 is a schematic diagram of a duplexer 50 that includes a receive filter 52 and a transmit filter 34 according to an embodiment. The receive filter 52 includes a plurality of BAW resonators S2, S3, P2, and P3, a shunt SAW resonator P1, and a series SAW resonator S1". In the receive filter 54, both the first series resonator S1" and the first shunt resonator P1 from the common node COM are SAW resonators. Other than both the first series resonator S1" and the first shunt resonator P1, all remaining acoustic wave resonators of the receive filter 52 can be BAW resonators. In the receive filter 52, the first filter stage from the common node includes a series SAW resonator S1" and a shunt SAW resonator P1. The shunt SAW resonator P1 can be TCSAW resonator, a non-temperature compensated SAW resonator, or a MPS SAW resonator. The series SAW resonator S1' can be TCSAW resonator, a non-temperature compensated SAW resonator, or a MPS SAW resonator. The shunt SAW resonator P1 can have a resonant frequency in the passband of the transmit filter 34. The first series resonator S1" and the first shunt resonator P1 can both contribute to desirable linearity performance of the transmit filter 34. The series SAW resonator S1" and the shunt SAW resonator P1 can both contribute to desirable linearity performance of the receive filter 52. More generally, the first series acoustic wave resonator and the first shunt acoustic wave resonator of a receive filter of a multiplexer can impact linearity and/or second harmonic performance of a transmit filter of the multiplexer.

Figure 10:
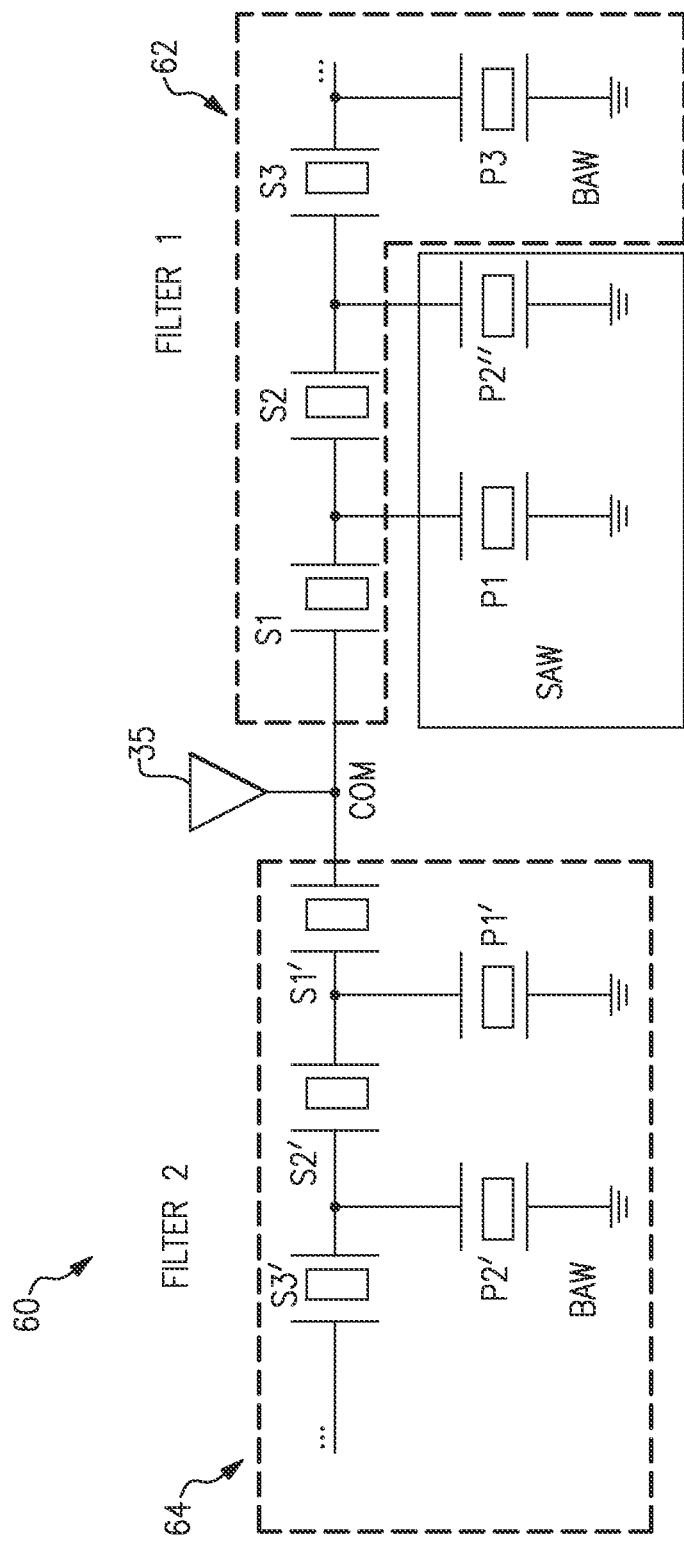
FIG. 10 is a schematic diagram of a multiplexer with a receive filter that includes a plurality of BAW resonators and two shunt SAW resonators according to an embodiment.

FIG. 10 is a schematic diagram of a duplexer 60 that includes a first filter 62 and a second filter 64 according to an embodiment. The first filter 62 includes a plurality of BAW resonators S1, S2, S3, and P3, a plurality of shunt SAW resonators P1 and P2". In the first filter 62, the first two shunt resonators P1 and P2" from the common node COM are SAW resonators. The shunt SAW resonators P1 and P2" can both have resonant frequencies in the passband of the second filter 64. The shunt SAW resonators P1 and P2" can improve second harmonic performance in the duplexer 60. FIG. 10 illustrates that the second shunt resonator from the common node of a multiplexer can be a SAW resonator to improve linearity of another filter of the multiplexer. The shunt SAW resonator P2" can be a TCSAW resonator, a non-temperature compensated SAW resonator, or a MPS SAW resonator. One or more additional shunt resonators can be SAW resonators in some applications as suitable. In certain applications, the first filter 62 is a receive filter and second filter 64 is a transmit filter. The first filter 62 and the second filter 64 can be associated with the same frequency band. Alternatively, the first filter 62 and the second filter 64 can be associated with different frequency bands.

Figure 11:
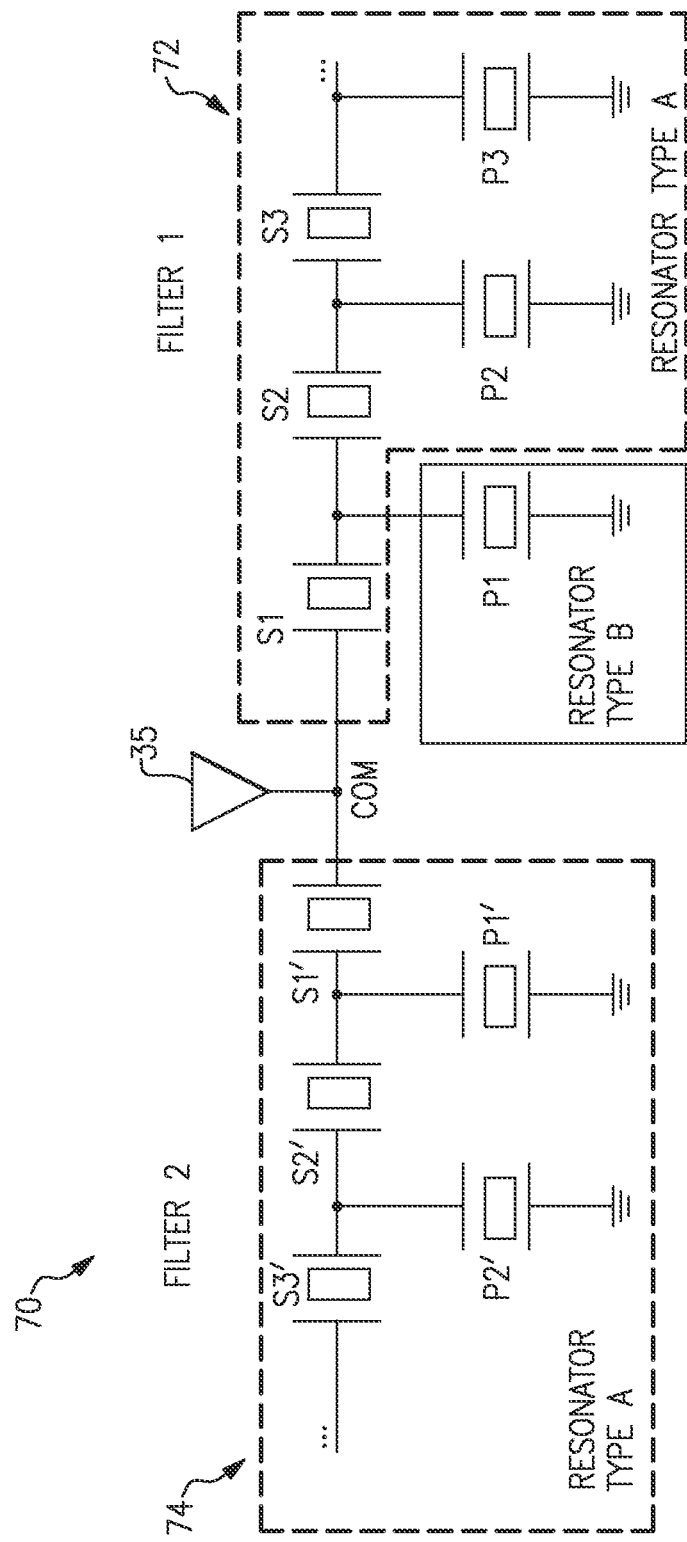
FIG. 11 is a schematic diagram of a multiplexer with a receive filter that includes a plurality of acoustic wave resonators of a first type and a shunt acoustic wave resonator of a second type according to an embodiment.

FIG. 11 is a schematic diagram of a duplexer 70 with a first filter 72 and a second filter 74 according to an embodiment. The first filter 72 includes a plurality of acoustic wave resonators S1, S2, S3, P2, and P3 of a first type and a shunt acoustic wave resonator P1 of a second type according to an embodiment. The second filter 74 includes a plurality of acoustic wave resonators S1', S2', S3', P1', P2', and P3' of the first type. Acoustic wave resonators of the second type can have better second harmonic performance than acoustic wave resonators of the first type. The second harmonic performance for the acoustic wave resonators can be better in the passband of the second filter 74. In certain instances, acoustic wave resonators of the first type can have a higher Q than acoustic wave resonators of the second type. Any suitable principles and advantages disclosed herein with reference to BAW resonators and SAW resonators can be applied to acoustic wave resonators of the first type and acoustic wave resonators of the second type. The first type of acoustic wave resonators can be FBARs or BAW SMRs. The second type of acoustic wave resonator can be TCSAW, non-TC SAW, or MPS SAW.

Although example embodiments may be discussed with filters or duplexers for illustrative purposes, any suitable principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include a shunt SAW resonator and a plurality of BAW resonators in accordance with any suitable principles and advantages disclosed herein.

Figure 12:
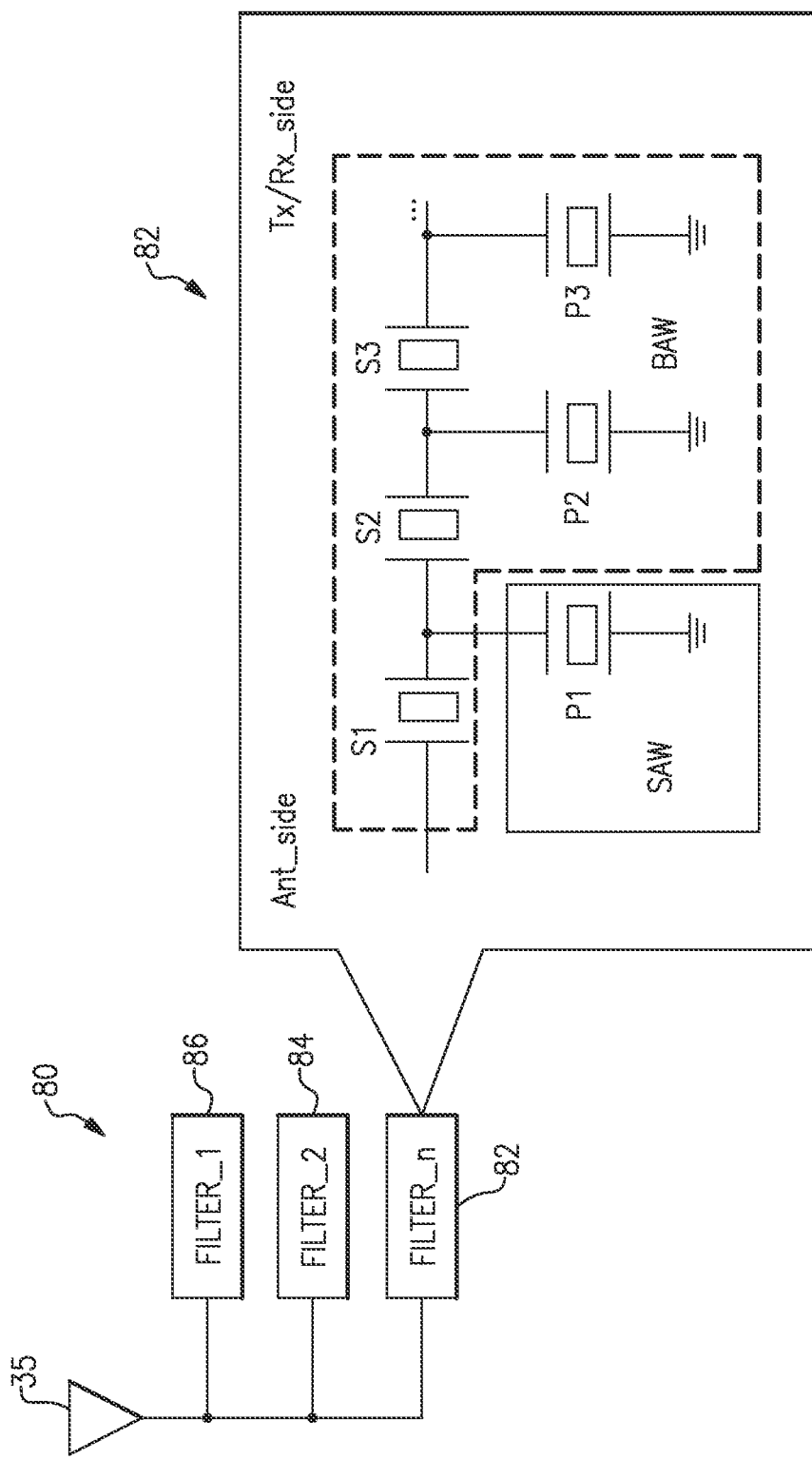
FIG. 12 is a schematic diagram of a multiplexer with a filter that includes a plurality of BAW resonators and a shunt SAW resonator according to an embodiment.

FIG. 12 is a schematic diagram of a multiplexer 80 with a filter 82 that includes a plurality of BAW resonators S1, S2, S3, P2, and P3 and a shunt SAW resonator P1 according to an embodiment. The illustrated multiplexer 80 also includes filters 84 and 86. In certain embodiments, one or more of the filters 84 and 86 are transmit filters. Any shunt resonator of the filter 82 that has a resonant frequency that overlaps with a passband of any other filter of the multiplexer 80 can be a SAW resonator. For example, in FIG. 12, the shunt SAW resonator P1 of the filter 82 can have a resonant frequency in the passband of the filter 84. In this example, the filter 84 can be a transmit filter. This transmit filter can have a passband that is below the passband of the filter 82 in the frequency domain. Having the shunt resonator P1 be a SAW resonator can be preferred in certain applications because the shunt resonator closest to the common node can typically contribute most to the second harmonic performance of one or more other filters with a lower passband than the filter 82.

In some other embodiments, one or more additional shunt resonators (e.g., P2 and/or P3) of the filter 82 can be SAW resonators instead of BAW resonators when a respective resonant frequency of the one or more additional shunt resonators is in within a passband of another filter of the multiplexer 80. In certain instances, two or more shunt resonators of the filter 82 can be SAW resonators with respective resonant frequencies within the passband of one other filter. In some instances, two or more shunt resonators of the filter 82 can be SAW resonators with respective resonant frequencies within passbands of at least two other filters of the multiplexer 80. A first series acoustic wave resonator of the filter 82 from the common node can be a SAW resonator in some applications.

Compared to TCSAW resonators and non-temperature compensated SAW resonators, MPS SAW resonators can have a higher Qp, where Qp is a quality factor at anti-resonance. The higher Qp for MPS SAW resonators can lead to better receive filter insertion loss. Accordingly, the shunt SAW resonator P1 of any of the embodiments disclosed herein can be an MPS SAW resonator in applications with low receive insertion loss specifications. If a shunt MPS SAW resonator P1 has a Qp that is similar to a BAW resonator, a filter with a shunt MPS SAW resonator and BAW resonators can achieve similar insertion loss to a filter with all BAW resonators.

The filters and multiplexers disclosed herein can be implemented and packaged in a variety of different ways for certain applications. Examples of packaging such filters and multiplexers will be discussed with reference to FIGS. 13 to 15B. In these examples, a SAW die can include one or more TCSAW resonators, one or more non-temperature compensated SAW resonators, one or more MPS SAW resonators, or any suitable combination thereof. In these examples, a SAW die can include one or more TCSAW resonators, one or more non-temperature compensated SAW resonators, one or more MPS SAW resonators, or any suitable combination thereof. In these examples, a BAW die can include one or more FBARS and/or one or more SMRs.

Figure 13:
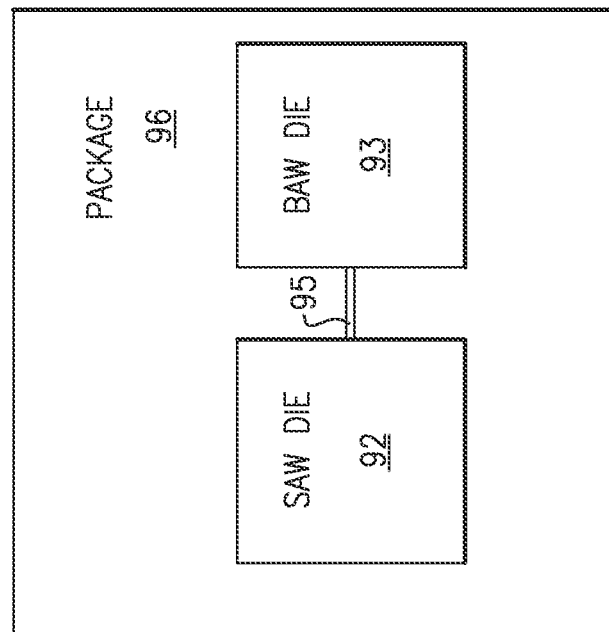
FIG. 13 is a schematic block diagram of acoustic filter dies according to an embodiment.

FIG. 13 is a schematic block diagram of acoustic filter dies according to an embodiment. A SAW die 92 can include one or more shunt SAW resonators, such as shunt SAW resonator P1 of any of the embodiments discussed above. A BAW die 93 can include BAW resonators of a filter that includes shunt SAW resonator P1. In some instances, the BAW die 93 can also include BAW resonators of one or more other filters. The SAW die 92 and the BAW die 93 can be on a common package substrate 94. The SAW die 92 and the BAW die 93 can be stacked with each other in certain applications. The SAW die 92 and the BAW die 93 can be positioned laterally relative to each other in various applications. The SAW die 92 can include an electrical connection 95 to electrically connect the shunt SAW resonator P1 to BAW resonators of the same filter on the BAW die 93. The electrical connection 95 can include a bump and/or a through via. Such a through via can extend through a substrate of one of the dies 92 and/or 93.

Figure 14:
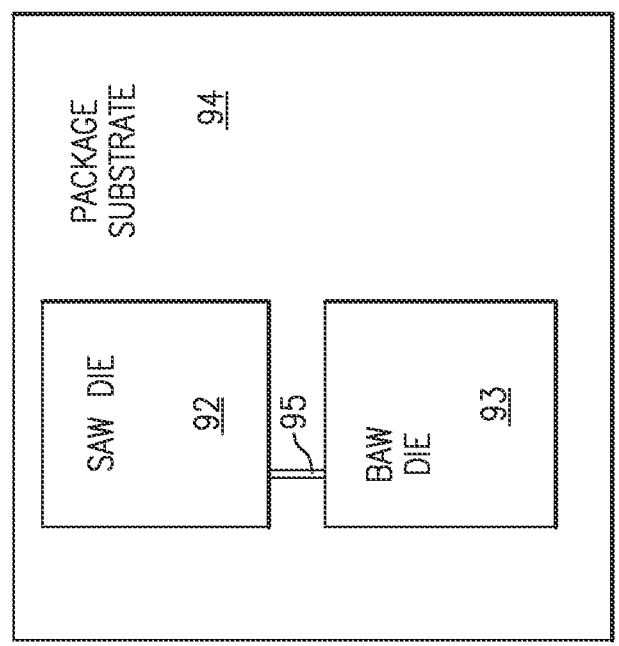
FIG. 14 is a schematic block diagram of co-packaged acoustic filter dies according to an embodiment.

FIG. 14 is a schematic block diagram of co-packaged acoustic filter dies according to an embodiment. As shown in FIG. 14, the SAW die 92 and the BAW die 93 can be co-packaged within a common package 96 in certain applications. A shunt SAW resonator of the SAW die 92 can be electrically connected to BAW resonators of the BAW die 93 by any suitable electrical connection 95 within the package 96.

FIGS. 15A and 15B are a schematic block diagrams of acoustic wave resonators of a multiplexer on a plurality of dies according to embodiments. As illustrated, in FIG. 15A, a multiplexer 97 can include a first filter with a shunt SAW resonator P1 on a SAW die 92 and SAW resonators of a second filter on the SAW die 92. The first filter can also include other resonators S1, S2, S3, P2, and P3 on the BAW die 93. One or more additional filters of BAW resonators can be included in the multiplexer 97 in certain applications. The one or more additional filters of BAW resonators can be implemented on the BAW die 93. For example, one additional filter of BAW resonators on the BAW die 93 is shown in FIG. 15A. As illustrated in FIG. 15B, a multiplexer 98 can include a first filter with a shunt SAW resonator P1 on a SAW die 92 and other resonators S1, S2, S3, P2, and P3 on the BAW die 93', SAW resonators of a second filter on the SAW die 92, and a third filter on another BAW die 99. Two or more BAW dies can be included in a multiplexer in accordance with any suitable principles and advantages disclosed herein.

The shunt SAW resonators disclosed herein can be TCSAW resonators, non-temperature compensated SAW resonators, or a MPS SAW resonators in various applications. Examples of such SAW resonators will be discussed with reference to FIGS. 16A to 18.

Figure 16A:
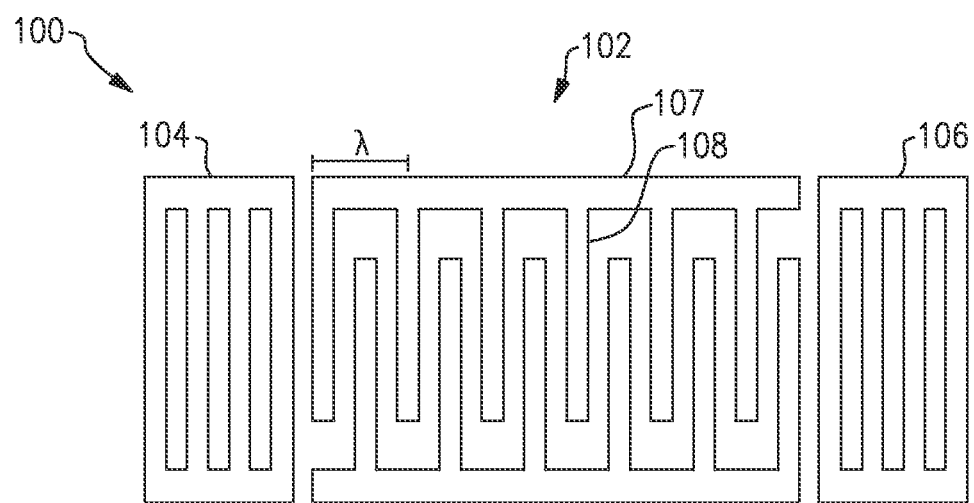
FIG. 16A is a top view of an interdigital transducer electrode of a SAW resonator.
Figure 16B:
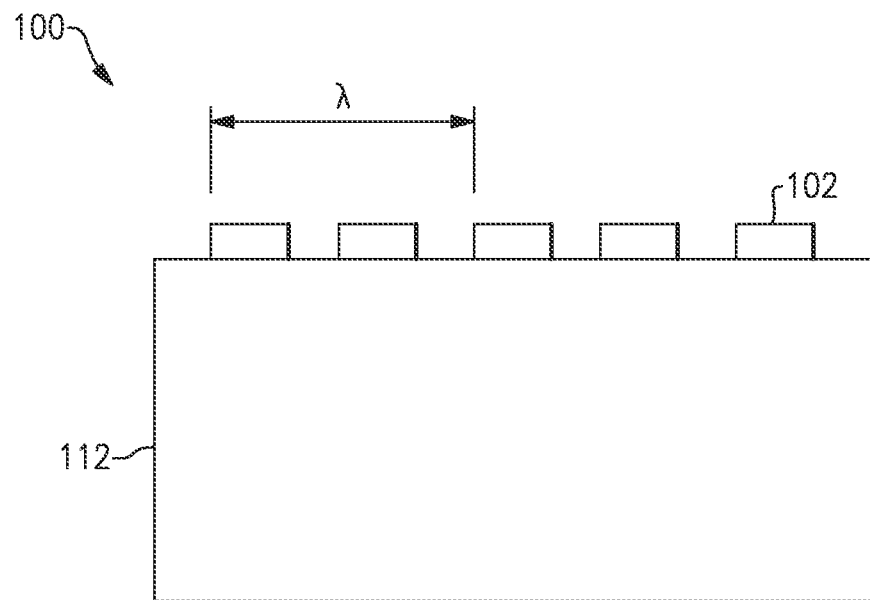
FIG. 16B is a cross-sectional view of the SAW resonator of FIG. 16A.

FIG. 16A is a top view of an interdigital transducer (IDT) electrode 102 of a SAW resonator 100. FIG. 16B is a cross-sectional view of the SAW resonator 100 of FIG. 16A. The IDT electrode 102 is positioned between a first acoustic reflector 104 and a second acoustic reflector 106. The acoustic reflectors 104 and 106 are separated from the IDT electrode 102 by respective gaps. The IDT electrode 102 includes the bus bar 107 and IDT fingers 108 extending from the bus bar 107. The IDT fingers 108 have a pitch of λ. The surface acoustic wave resonator 100 can include any suitable number of IDT fingers 108. The pitch λ of the IDT fingers 108 corresponds to wavelength of a surface acoustic wave generated by the surface acoustic wave resonator 100.

The SAW resonator 100 illustrated in FIG. 16B includes a piezoelectric layer 112 and an IDT electrode 102 on the piezoelectric layer 112. The piezoelectric layer 112 can be a lithium niobate layer or a lithium tantalate layer, for example. The IDT electrode 102 can include any suitable material for an electrode, such as tungsten, aluminum, molybdenum, the like, or any suitable combination or alloy thereof. The SAW resonator 110 can be arranged as a shunt resonator in a filter in accordance with any suitable principles and advantages disclosed herein.

Figure 17:
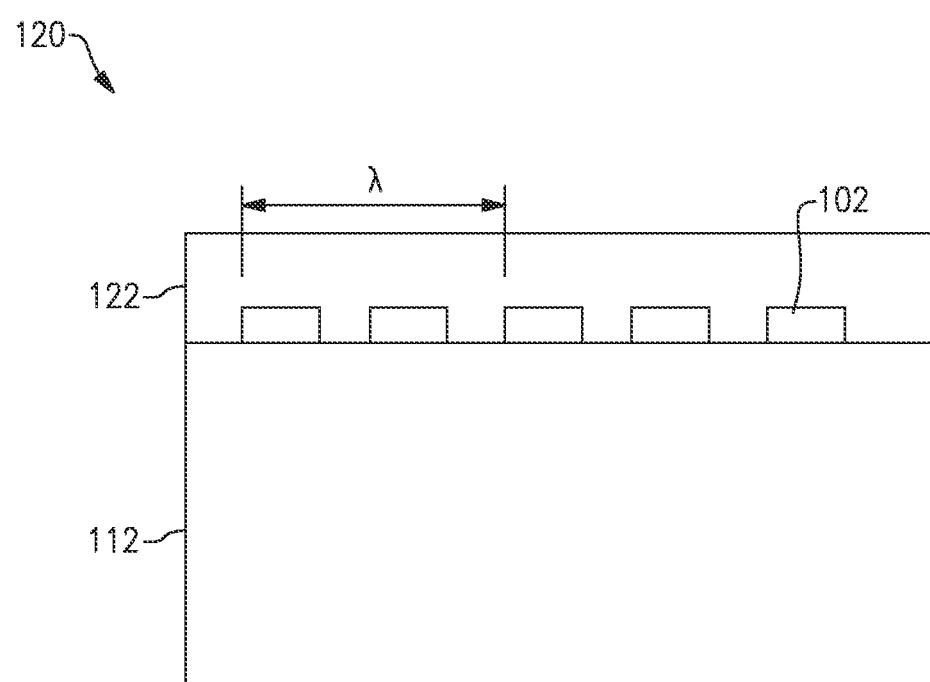
FIG. 17 is a cross-sectional view of a temperature compensated SAW (TCSAW) resonator.

FIG. 17 is a cross-sectional view of a TCSAW resonator 120. The illustrated TCSAW resonator 120 includes a piezoelectric layer 112, an IDT electrode 102 on the piezoelectric layer 112, and a temperature compensation layer 122 over the IDT electrode 102. The TCSAW resonator 120 is like the SAW resonator 110, except that the TCSAW resonator 120 includes a temperature compensation layer 122 over the IDT electrode 102. The TCSAW resonator 120 can be arranged as a shunt resonator in a filter in accordance with any suitable principles and advantages disclosed herein.

The temperature compensation layer 122 can bring the temperature coefficient of frequency (TCF) of the TCSAW resonator 120 closer to zero relative to a similar SAW resonator without the temperature compensation layer 122. The temperature compensation layer 122 can have a positive TCF. This can compensate for the piezoelectric layer 112 having a negative TCF. The temperature compensation layer 122 can be a silicon dioxide ($SiO_2$) layer. The temperature compensation layer 122 can include any other suitable temperature compensating material including without limitation a tellurium dioxide ($TeO_2$) layer or a silicon oxyfluoride (SiOF layer). The temperature compensation layer 122 can include any suitable combination of $SiO_2$, $TeO_2$, and/or SiOF.

Figure 18:
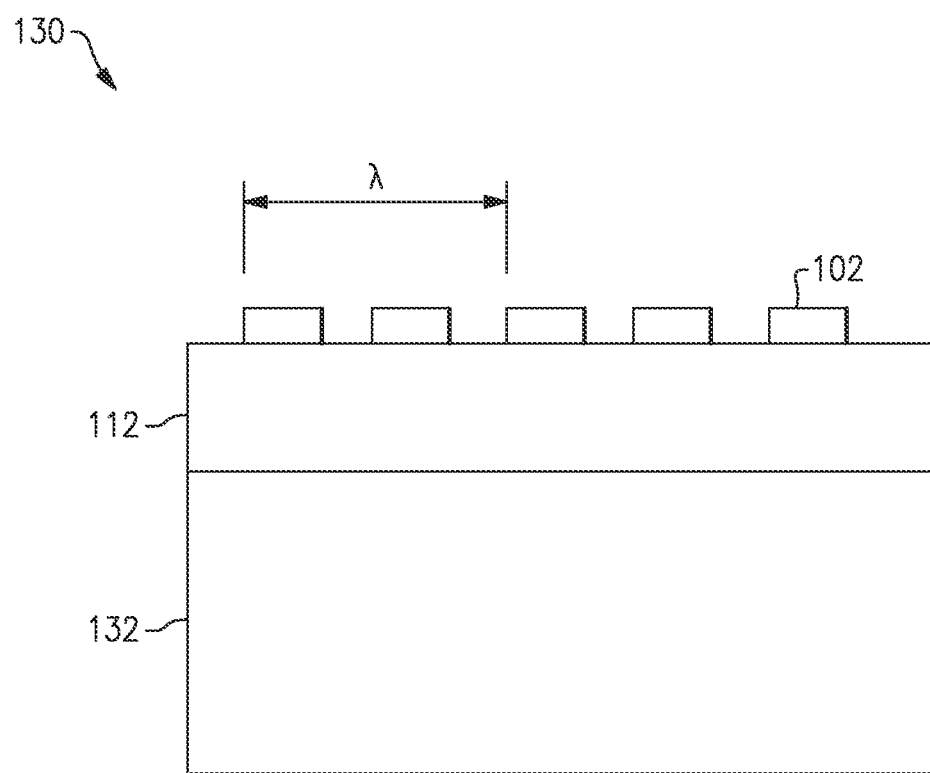
FIG. 18 is a cross-sectional view of a multilayer piezoelectric substrate (MPS) SAW resonator.

FIG. 18 is a cross-sectional view of an MPS SAW resonator 130. The illustrated MPS SAW resonator 130 includes a multilayer piezoelectric substrate including a piezoelectric layer 112 and a support substrate 132. The MPS SAW resonator 130 also includes an IDT electrode 102 on the piezoelectric layer 112. The MPS SAW resonator 130 is like the SAW resonator 110, except that the MPS SAW resonator 130 includes the support substrate 132. In certain applications, the piezoelectric layer 112 can be thinner in the MPS SAW resonator 130 compared to in the SAW resonator 110. For example, the piezoelectric layer 112 can have a thickness of less than $\lambda$ in the MPS SAW resonator 130, in which $\lambda$ is a wavelength of a surface acoustic wave generated by the MPS SAW resonator 130. In some other instances, the piezoelectric layer 112 can have a thickness on the order of 10s of $\lambda$, in which $\lambda$ is a wavelength of a surface acoustic wave generated by the MPS SAW resonator 130. The MPS SAW resonator 130 can be arranged as a shunt resonator in a filter in accordance with any suitable principles and advantages disclosed herein.

The support substrate 132 can be a silicon substrate, a quartz substrate, a sapphire substrate, a polycrystalline spinel substrate, or any other suitable carrier substrate. As one example, the MPS SAW resonator 130 can include a piezoelectric layer 112 that is lithium tantalate and a support substrate 132 that is silicon.

In some instances (not illustrated), one or more additional layers can be included in the multilayer piezoelectric substrate of an MPS SAW resonator. Non-limiting examples of a layer of the one or more additional layers include a silicon dioxide layer, a silicon nitride layer, an aluminum nitride layer, an adhesion layer, a dispersion adjustment layer, and a thermal dissipation layer. As an illustrative example, a multilayer piezoelectric substrate can include a lithium tantalate layer over a silicon dioxide layer over an aluminum nitride layer over a silicon layer. As one more illustrative example, a multilayer piezoelectric substrate can include a lithium niobate layer over a silicon dioxide layer over a high impedance layer, in which the high impedance layer has a higher acoustic impedance than the lithium niobate layer. In some instances (not illustrated), a temperature compensation layer can be included over an IDT electrode of an MPS SAW resonator.

A filter that includes a shunt SAW resonator and a plurality of BAW resonators in accordance with any suitable principles and advantages disclosed herein be arranged to filter a radio frequency signal in a fifth generation 5G NR operating band within Frequency Range 1 (FR1) can be from 410 MHz to 7.125 gigahertz (GHz), for example, as specified in a current 5G NR specification. A filter that includes a shunt SAW resonator and a plurality of BAW resonators in accordance with any suitable principles and advantages disclosed herein can be arranged to filter a radio frequency signal in a fourth generation (4G) Long Term Evolution (LTE) operating band. A filter that includes a shunt SAW resonator and a plurality of BAW resonators in accordance with any suitable principles and advantages disclosed herein can be included in a filter having a passband that includes a 4G LTE operating band and a 5G NR operating band. Such a filter can be implemented in a dual connectivity application, such as an E-UTRAN New Radio-Dual Connectivity (ENDC) application. A multiplexer including any such filters can include one or more other filters with a passband corresponding to a 5G NR operating band and/or a 4G LTE operating band.

Filters disclosed herein can be implemented in a standalone filter and/or in a filter in any suitable multiplexer. Example multiplexers will be discussed with reference to FIGS. 19A to 19C. Any suitable principles and advantages of these filters and/or multiplexers disclosed herein can be implemented together with each other.

Figure 19A:
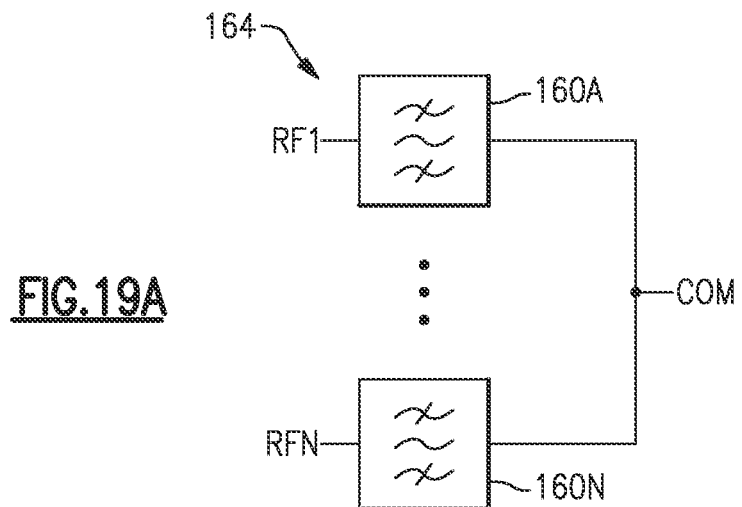
FIG. 19A is a schematic diagram of a multiplexer with hard multiplexing.

FIG. 19A is a schematic diagram of a multiplexer 164. The multiplexer 164 includes a plurality of filters 160A to 160N coupled together at a common node COM. The plurality of filters can include any suitable number of filters including, for example, 2 filters, 3 filters, 4 filters, 5 filters, 6 filters, 7 filters, 8 filters, or more filters. Some or all of the plurality of acoustic wave filters can be acoustic wave filters. As illustrated, the filters 160A to 160N each have a fixed electrical connection to the common node COM. This can be referred to as hard multiplexing or fixed multiplexing. Filters have fixed electrical connections to the common node in hard multiplexing applications.

The first filter 160A is an acoustic wave filter arranged to filter a radio frequency signal. The first filter 160A can include acoustic wave devices coupled between a first radio frequency node RF1 and the common node COM. The first radio frequency node RF1 can be a transmit node or a receive node. The first filter 160A includes a shunt SAW resonator and a plurality of BAW resonators in accordance with any suitable principles and advantages disclosed herein. The other filter(s) of the multiplexer 164 can include one or more acoustic wave filters, one or more acoustic wave filters that include BAW resonators, one or more acoustic wave filters that include a shunt SAW resonator and a plurality of BAW resonators, one or more LC filters, one or more hybrid acoustic wave LC filters, the like, or any suitable combination thereof.

Figure 19B:
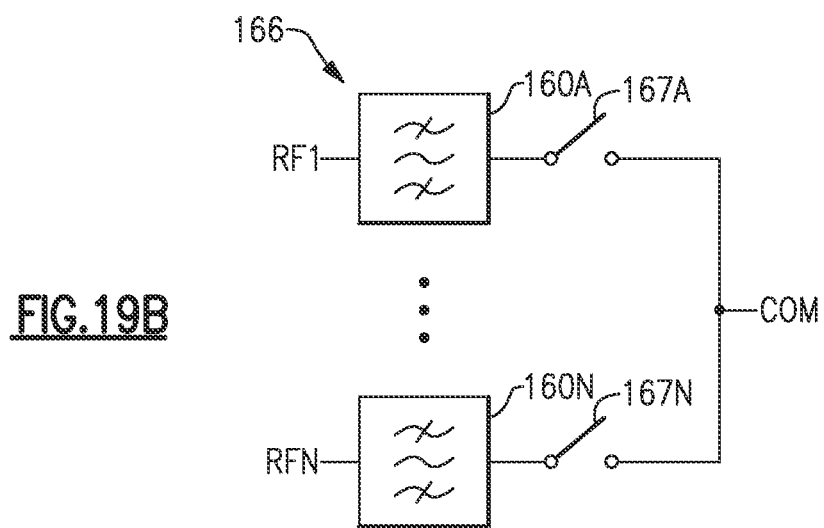
FIG. 19B is a schematic diagram of a multiplexer with switched multiplexing.

FIG. 19B is a schematic diagram of a multiplexer 166. The multiplexer 166 is like the multiplexer 164 of FIG. 19A, except that the multiplexer 166 implements switched multiplexing. In switched multiplexing, a filter is coupled to a common node via a switch. In the multiplexer 166, the switches 167A to 167N can selectively electrically connect respective filters 160A to 160N to the common node COM. For example, the switch 167A can selectively electrically connect the first filter 160A the common node COM via the switch 167A. Any suitable number of the switches 167A to 167N can electrically a respective filters 160A to 160N to the common node COM in a given state. Similarly, any suitable number of the switches 167A to 167N can electrically isolate a respective filter 160A to 160N to the common node COM in a given state. The functionality of the switches 167A to 167N can support various carrier aggregations.

Figure 19C:
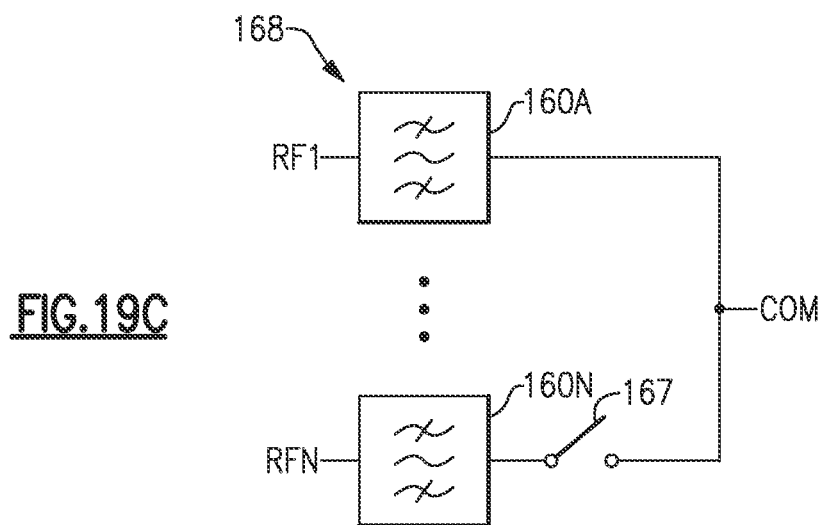
FIG. 19C is a schematic diagram of a multiplexer with a combination of hard multiplexing and switched multiplexing.

FIG. 19C is a schematic diagram of a multiplexer 168. The multiplexer 168 illustrates that a multiplexer can include any suitable combination of hard multiplexed and switched multiplexed filters. A shunt SAW resonator and a plurality of BAW resonators can be included in a filter that is hard multiplexed to the common node of a multiplexer. Alternatively or additionally, a shunt SAW resonator and a plurality of BAW resonators in accordance with any suitable principles and advantages disclosed herein can be included in a filter that is switch multiplexed to the common node of a multiplexer.

The acoustic wave filters and multiplexers disclosed herein can be implemented in a variety of packaged modules. Some example packaged modules will now be disclosed in which any suitable principles and advantages of the acoustic wave devices, acoustic wave filters, or multiplexers disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 20 to 24 are schematic block diagrams of illustrative packaged modules according to certain embodiments. Any suitable combination of features of these packaged modules can be implemented with each other. While duplexers are illustrated in the example packaged modules of FIGS. 21, 22, and 24, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 20:
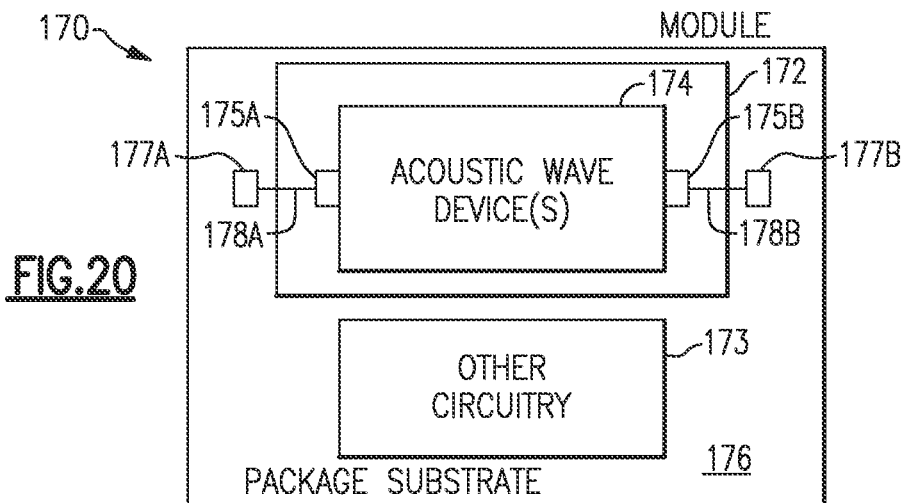
FIG. 20 is a schematic diagram of a radio frequency module that includes an acoustic wave filter according to an embodiment.

FIG. 20 is a schematic diagram of a radio frequency module 170 that includes an acoustic wave component 172 according to an embodiment. The illustrated radio frequency module 170 includes the acoustic wave component 172 and other circuitry 173. The acoustic wave component 172 can include one or more filters and/or multiplexers in accordance with any suitable combination of features of the filters and/or multiplexers disclosed herein. The acoustic wave component 172 can include an acoustic wave filter that includes a plurality of bulk acoustic wave resonators and a shunt SAW resonator, for example.

The acoustic wave component 172 shown in FIG. 20 includes acoustic wave devices 174 and terminals 175A and 175B. The acoustic wave devices 174 can include at least one shunt SAW resonator and a plurality of BAW resonators in accordance with any suitable principles and advantages disclosed herein. The terminals 175A and 174B can serve, for example, as an input contact and an output contact. Although two terminals are illustrated, any suitable number of terminals can be implemented for a particular application. The acoustic wave component 172 and the other circuitry 173 are on a common packaging substrate 176 in FIG. 20. The packaging substrate 176 can be a laminate substrate. The terminals 175A and 175B can be electrically connected to contacts 177A and 177B, respectively, on the packaging substrate 176 by way of electrical connectors 178A and 178B, respectively. The electrical connectors 178A and 178B can be bumps or wire bonds, for example.

The other circuitry 173 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 173 can be electrically connected to the one or more acoustic wave devices 174. The radio frequency module 170 can include one or more packaging structures to, for example, provide protection and/or facilitate easier handling of the radio frequency module 170. Such a packaging structure can include an overmold structure formed over the packaging substrate 176. The overmold structure can encapsulate some or all of the components of the radio frequency module 170.

Figure 21:
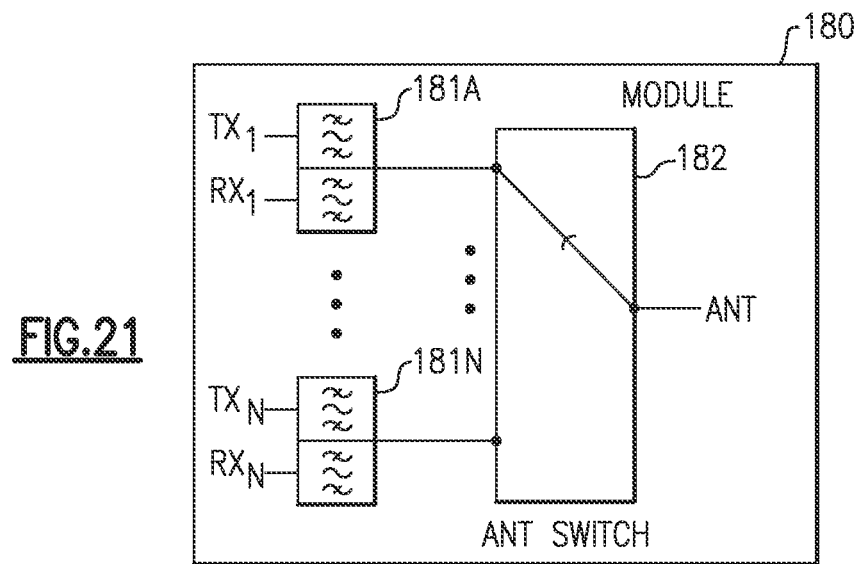
FIG. 21 is a schematic block diagram of a module that includes an antenna switch and duplexers according to an embodiment.

FIG. 21 is a schematic block diagram of a module 180 that includes duplexers 181A to 181N and an antenna switch 182. One or more of the duplexers 181A to 181N be implemented in accordance with any suitable principles and advantages disclosed herein. Any suitable number of duplexers 181A to 181N can be implemented. The antenna switch 182 can have a number of throws corresponding to the number of duplexers 181A to 181N. The antenna switch 182 can include one or more additional throws coupled to one or more filters external to the module 180 and/or coupled to other circuitry. The antenna switch 182 can electrically couple a selected duplexer to an antenna port of the module 180.

Figures 22, 23:
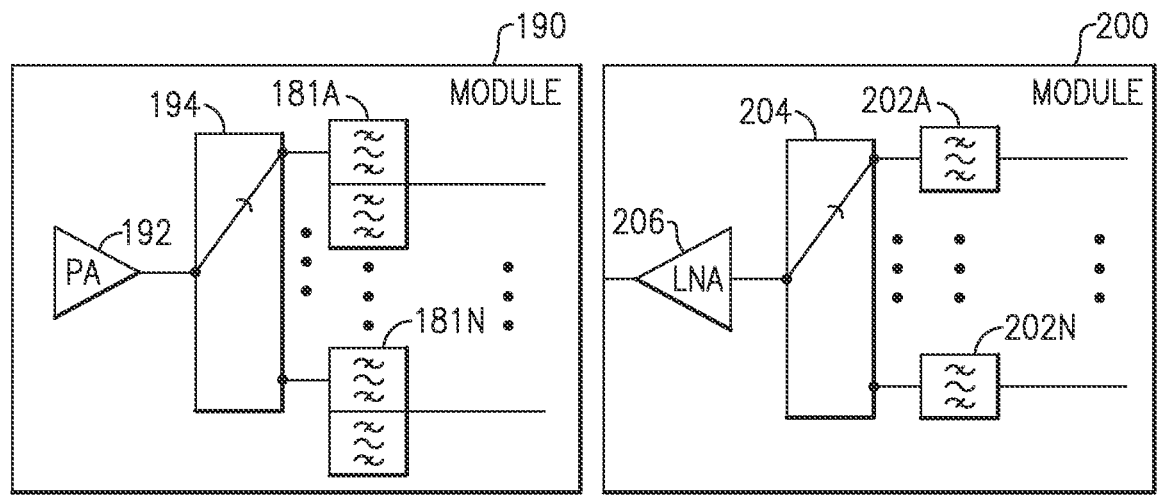
FIG. 22 is a schematic block diagram of a module that includes a power amplifier, a radio frequency switch, and duplexers according to an embodiment.
FIG. 23 is a schematic block diagram of a module that includes a low noise amplifier, a radio frequency switch, and filters according to an embodiment.

FIG. 22 is a schematic block diagram of a module 190 that includes a power amplifier 192, a radio frequency switch 194, and duplexers 181A to 181N according to an embodiment. The power amplifier 192 can amplify a radio frequency signal. The radio frequency switch 194 can be a multi-throw radio frequency switch. The radio frequency switch 194 can electrically couple an output of the power amplifier 192 to a selected transmit filter of the duplexers 181A to 181N. One or more of the duplexers 181A to 181N can be implemented in accordance with any suitable principles and advantages disclosed herein. Any suitable number of duplexers 181A to 181N can be implemented.

FIG. 23 is a schematic block diagram of a module 200 that includes filters 202A to 202N, a radio frequency switch 204, and a low noise amplifier 206 according to an embodiment. One or more filters of the filters 202A to 202N can be implemented in accordance with any suitable principles and advantages disclosed herein. Any suitable number of filters 202A to 202N can be implemented. The illustrated filters 202A to 202N are receive filters. One or more of the filters 202A to 202N can be included in a multiplexer that also includes a transmit filter and/or another receive filter. The radio frequency switch 204 can be a multi-throw radio frequency switch. The radio frequency switch 204 can electrically couple an output of a selected filter of filters 202A to 202N to the low noise amplifier 206. In some embodiments, a plurality of low noise amplifiers can be implemented. The module 200 can include diversity receive features in certain applications.

Figure 24:
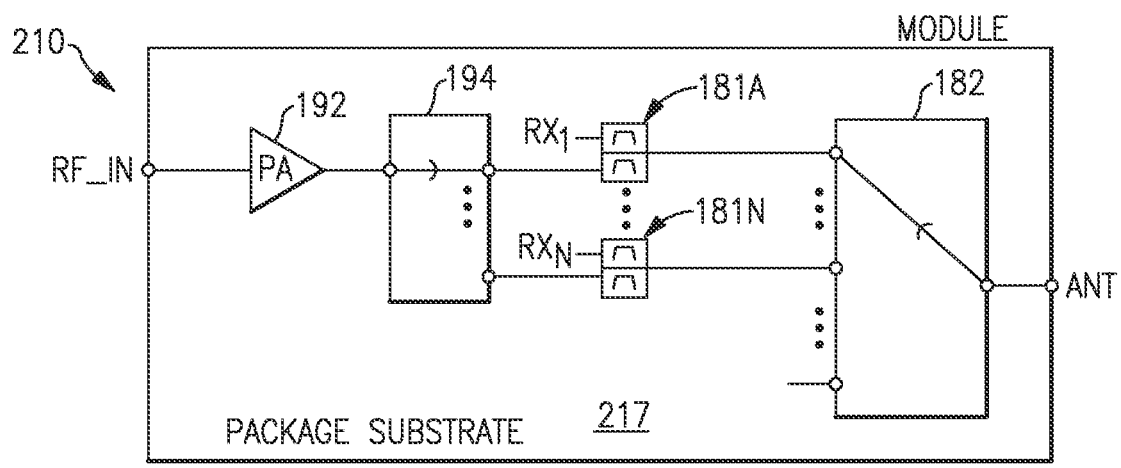
FIG. 24 is a schematic diagram of a radio frequency module that includes an acoustic wave filter according to an embodiment.

FIG. 24 is a schematic diagram of a radio frequency module 210 that includes an acoustic wave filter according to an embodiment. As illustrated, the radio frequency module 210 includes duplexers 181A to 181N, a power amplifier 192, a radio frequency switch 194, and an antenna switch 182. The radio frequency module 210 can include a package that encloses the illustrated elements. The illustrated elements can be disposed on a common packaging substrate 217. The packaging substrate 217 can be a laminate substrate, for example. A radio frequency module that includes a power amplifier can be referred to as a power amplifier module. A radio frequency module can include a subset of the elements illustrated in FIG. 24 and/or additional elements. The radio frequency module 210 may include one or more duplexers 181A to 181N implemented in accordance with any suitable principles and advantages disclosed herein.

The duplexers 181A to 181N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. Although FIG. 24 illustrates duplexers, any suitable principles and advantages disclosed herein can be implemented in other multiplexers (e.g., quadplexers, hexaplexers, octoplexers, etc.) and/or in multiplexers with switched multiplexing and/or with standalone filters.

The power amplifier 192 can amplify a radio frequency signal. The illustrated radio frequency switch 194 is a multi-throw switch. The switch 194 can electrically couple an output of the power amplifier 192 to a selected transmit filter of the transmit filters of the duplexers 181A to 181N. In some instances, the switch 194 can electrically connect the output of the power amplifier 192 to more than one of the transmit filters. The antenna switch 182 can selectively couple a signal from one or more of the duplexers 181A to 181N to an antenna port ANT. The duplexers 181A to 181N can be associated with different frequency bands and/or different modes of operation (e.g., different power modes, different signaling modes, etc.).

Figure 25:
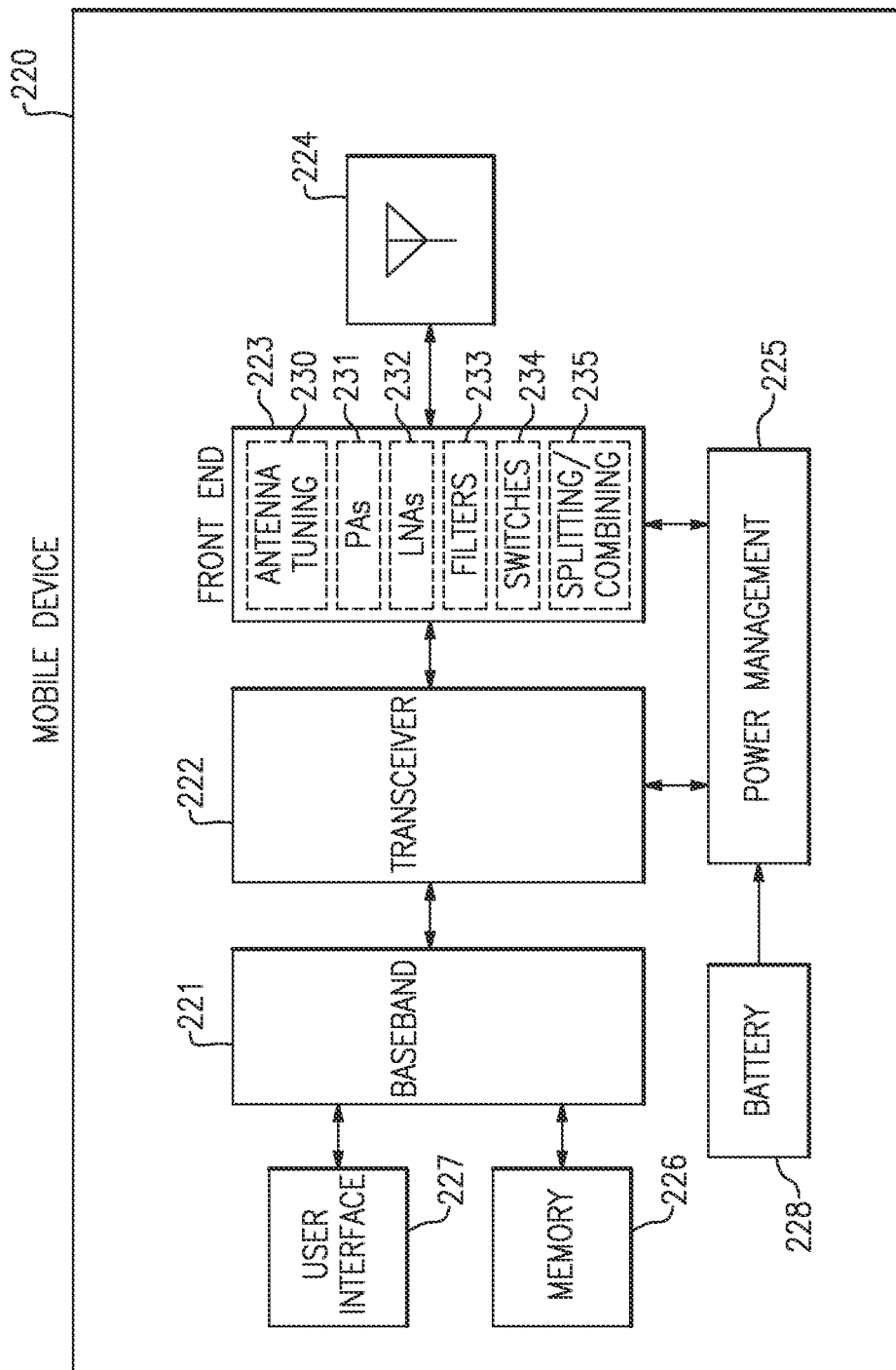
FIG. 25 is a schematic block diagram of a wireless communication device that includes a filter according to an embodiment.

The acoustic wave filters and multiplexers disclosed herein can be implemented in wireless communication devices. FIG. 25 is a schematic block diagram of a wireless communication device 220 that includes a filter according to an embodiment. The wireless communication device 220 can be a mobile device. The wireless communication device 220 can be any suitable wireless communication device. For instance, a wireless communication device 220 can be a mobile phone, such as a smart phone. As illustrated, the wireless communication device 220 includes a baseband system 221, a transceiver 222, a front end system 223, one or more antennas 224, a power management system 225, a memory 226, a user interface 227, and a battery 228.

The wireless communication device 220 can be used communicate using a wide variety of communications technologies, including, but not limited to, 2G, 3G, 4G (including LTE, LTE-Advanced, and/or LTE-Advanced Pro), 5G NR, WLAN (for instance, Wi-Fi), WPAN (for instance, Bluetooth and/or ZigBee), WMAN (for instance, WiMax), and/or GPS technologies.

The transceiver 222 generates RF signals for transmission and processes incoming RF signals received from the antennas 224. Various functionalities associated with the transmission and receiving of RF signals can be achieved by one or more components that are collectively represented in FIG. 25 as the transceiver 222. In one example, separate components (for instance, separate circuits or dies) can be provided for handling certain types of RF signals.

The front end system 223 aids in conditioning signals provided to and/or received from the antennas 224. In the illustrated embodiment, the front end system 223 includes antenna tuning circuitry 230, power amplifiers (PAs) 231, low noise amplifiers (LNAs) 232, filters 233, switches 234, and signal splitting/combining circuitry 235. However, other implementations are possible. The filters 233 can include one or more acoustic wave filters or multiplexer implemented in accordance with any suitable principles and advantages disclosed herein.

For example, the front end system 223 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 220 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 224 can include antennas used for a wide variety of types of communications. For example, the antennas 224 can include antennas for transmitting and/or receiving signals associated with a wide variety of frequencies and communications standards.

In certain implementations, the antennas 224 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 220 can operate with beamforming in certain implementations. For example, the front end system 223 can include amplifiers having controllable gain and phase shifters having controllable phase to provide beam formation and directivity for transmission and/or reception of signals using the antennas 224. For example, in the context of signal transmission, the amplitude and phases of the transmit signals provided to the antennas 224 are controlled such that radiated signals from the antennas 224 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 224 from a particular direction. In certain implementations, the antennas 224 include one or more arrays of antenna elements to enhance beamforming.

The baseband system 221 is coupled to the user interface 227 to facilitate processing of various user input and output (I/O), such as voice and data. The baseband system 221 provides the transceiver 222 with digital representations of transmit signals, which the transceiver 222 processes to generate RF signals for transmission. The baseband system 221 also processes digital representations of received signals provided by the transceiver 222. As shown in FIG. 25, the baseband system 221 is coupled to the memory 226 of facilitate operation of the wireless communication device 220.

The memory 226 can be used for a wide variety of purposes, such as storing data and/or instructions to facilitate the operation of the wireless communication device 220 and/or to provide storage of user information.

The power management system 225 provides a number of power management functions of the wireless communication device 220. In certain implementations, the power management system 225 includes a PA supply control circuit that controls the supply voltages of the power amplifiers 231. For example, the power management system 225 can be configured to change the supply voltage(s) provided to one or more of the power amplifiers 231 to improve efficiency, such as power added efficiency (PAE).

As shown in FIG. 25, the power management system 225 receives a battery voltage from the battery 228. The battery 228 can be any suitable battery for use in the wireless communication device 220, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A multiplexer with acoustic wave resonators, the multiplexer comprising:
   a first filter configured to filter a radio frequency signal, the first filter having a first passband, and the first filter including a plurality of bulk acoustic wave resonators and a shunt surface acoustic wave resonator; and
   a second filter coupled to the first filter at a common node, the second filter having a second passband that is below the first passband, and the shunt surface acoustic wave resonator having a resonant frequency that is in the second passband.

2. The multiplexer of claim 1 wherein the first filter is a receive filter.

3. The multiplexer of claim 2 wherein the second filter is a transmit filter.

4. The multiplexer of claim 1 wherein the shunt surface acoustic wave resonator is configured to cause second harmonic distortion at the common node to be reduced.

5. The multiplexer of claim 1 wherein the shunt surface acoustic wave resonator is an only surface acoustic wave resonator of the first filter.

6. The multiplexer of claim 1 wherein the shunt surface acoustic wave resonator is a first shunt acoustic wave resonator of the first filter from the common node.

7. The multiplexer of claim 1 wherein the shunt surface acoustic wave resonator and the plurality of bulk acoustic wave resonators are all acoustic wave resonators of the first filter.

8. The multiplexer of claim 1 wherein the shunt surface acoustic wave resonator is a temperature compensated surface acoustic wave resonator.

9. The multiplexer of claim 1 wherein the shunt surface acoustic wave resonator is a multilayer piezoelectric substrate surface acoustic wave resonator.

10. The multiplexer of claim 1 wherein the second filter includes a second plurality of bulk acoustic wave resonators.

11. The multiplexer of claim 1 wherein the first filter includes a series surface acoustic wave resonator and all of the plurality of bulk acoustic wave resonators are coupled to the common node by way of the series surface acoustic wave resonator.

12. The multiplexer of claim 11 wherein the second filter includes a second plurality of bulk acoustic wave resonators, the second plurality of bulk acoustic wave resonators including shunt bulk acoustic wave resonators and series bulk acoustic wave resonators.

13. The multiplexer of claim 1 further comprising a third filter coupled to the common node.

14. The multiplexer of claim 1 wherein the second passband is associated with a fifth generation New Radio band.

15. A multiplexer including acoustic wave filters, the multiplexer comprising:
   a transmit filter including a plurality of acoustic wave resonators, the transmit filter configured to filter a radio frequency signal, and the transmit filter having a transmit passband; and
   a receive filter coupled to the transmit filter at a common node, the receive filter including a plurality of bulk acoustic wave resonators and a shunt surface acoustic wave resonator, the shunt surface acoustic wave resonator having a resonant frequency in the transmit passband.

16. The multiplexer of claim 15 wherein the plurality of acoustic wave resonators include bulk acoustic wave resonators, and the shunt surface acoustic wave resonator is a first shunt acoustic wave resonator of the receive filter from the common node.

17. A multiplexer including acoustic wave filters, the multiplexer comprising:
   a first acoustic wave filter coupled to a common node, the first acoustic wave filter configured to filter a radio frequency signal, and the first acoustic wave filter having a passband;
   a second acoustic wave filter coupled to the common node; and
   a third acoustic wave filter coupled to the common node, the third acoustic wave filter including a plurality of bulk acoustic wave resonators and a shunt surface acoustic wave resonator, the shunt surface acoustic wave resonator having a resonant frequency in the passband.

18. The multiplexer of claim 17 wherein the third acoustic wave filter is a receive filter, and the first acoustic wave filter is a transmit filter.

19. The multiplexer of claim 17 wherein the shunt surface acoustic wave resonator is a first shunt acoustic wave resonator of the third acoustic wave filter from the common node.

20. The multiplexer of claim 17 wherein the shunt surface acoustic wave resonator and the plurality of bulk acoustic wave resonators are all acoustic wave resonators of the third acoustic wave filter.

* * * * *